(12) United States Patent
Lee et al.

(10) Patent No.: US 10,798,849 B2
(45) Date of Patent: Oct. 6, 2020

(54) ELECTRONIC DEVICE HAVING HEAT COLLECTION/DIFFUSION STRUCTURE

(71) Applicant: Samsung Electronics Co., Ltd., Gyeonggi-do (KR)

(72) Inventors: Haejin Lee, Seoul (KR); Kyungha Koo, Seoul (KR); Chunghyo Jung, Gyeonggi-do (KR); Se-Young Jang, Gyeonggi-do (KR); Jungje Bang, Gyeonggi-do (KR); Jaeheung Ye, Gyeonggi-do (KR); Chi-Hyun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/515,275

(22) Filed: Jul. 18, 2019

(65) Prior Publication Data

US 2019/0364695 A1    Nov. 28, 2019

Related U.S. Application Data

(63) Continuation of application No. 15/999,729, filed as application No. PCT/KR2017/001599 on Feb. 14, 2017.

(51) Int. Cl.
*H05K 7/20* (2006.01)
*F28D 15/02* (2006.01)
(Continued)

(52) U.S. Cl.
CPC ..... *H05K 7/20336* (2013.01); *F28D 15/0233* (2013.01); *F28D 15/0275* (2013.01);
(Continued)

(58) Field of Classification Search
CPC ... H05K 7/20336; H05K 9/0024–0028; H05K 9/0081; F28D 15/0233;
(Continued)

(56) References Cited

U.S. PATENT DOCUMENTS

| 5,930,115 A | 7/1999 | Tracy et al. |
| 8,908,373 B2 | 12/2014 | Sakamoto et al. |

(Continued)

FOREIGN PATENT DOCUMENTS

| CN | 102811588 A | 12/2012 |
| CN | 103098575 A | 5/2013 |

(Continued)

OTHER PUBLICATIONS

Chinese Office Action dated Nov. 4, 2019, issued in Chinese Application No. 201780012181.1.
(Continued)

*Primary Examiner* — Jacob R Crum
(74) *Attorney, Agent, or Firm* — Jefferson IP Law, LLP

(57) ABSTRACT

An electronic device having an improved heating state is disclosed. The disclosed electronic device can comprise: a housing including a first surface facing a first direction, and a second surface facing a second direction opposite to the first direction; a printed circuit board inserted between the first surface and the second surface; an electronic component disposed on the printed circuit board; a shielding structure mounted on the printed circuit board, and including a conductive structure for at least partially surrounding the electronic device; and a heat pipe including a first end portion and a second end portion, wherein the first end portion is thermally coupled to a portion of the shielding structure, and the first end portion is disposed closer to the shielding structure than the second end portion. Additionally, other examples are possible.

25 Claims, 44 Drawing Sheets

(51) Int. Cl.
*H01L 23/427* (2006.01)
*G06F 1/20* (2006.01)
*H05K 9/00* (2006.01)

(52) U.S. Cl.
CPC ............ *G06F 1/203* (2013.01); *H01L 23/427* (2013.01); *H05K 9/0024* (2013.01); *H05K 9/0081* (2013.01)

(58) Field of Classification Search
CPC . F28D 15/0275; H01L 23/427; H01L 33/648; G06F 1/203
See application file for complete search history.

(56) References Cited

U.S. PATENT DOCUMENTS

| | | | |
|---|---|---|---|
| 9,854,678 B2 | 12/2017 | Song et al. | |
| 10,103,087 B2 | 10/2018 | Jin et al. | |
| 2002/0166683 A1* | 11/2002 | Shlahtichman | H05K 9/0032 174/363 |
| 2003/0161132 A1 | 8/2003 | Shimoji et al. | |
| 2003/0193794 A1 | 10/2003 | Reis et al. | |
| 2006/0128068 A1* | 6/2006 | Murray | H01L 21/4882 438/120 |
| 2007/0211431 A1* | 9/2007 | Munch | H01L 23/40 361/696 |
| 2009/0004902 A1* | 1/2009 | Pandey | H01L 23/427 439/331 |
| 2011/0042042 A1* | 2/2011 | Kim | F28F 1/08 165/104.26 |
| 2011/0242764 A1* | 10/2011 | Hill | G06F 1/203 361/705 |
| 2012/0069522 A1 | 3/2012 | Hung | |
| 2012/0160456 A1 | 6/2012 | Aoki | |
| 2012/0307452 A1 | 12/2012 | Yan et al. | |
| 2014/0313680 A1* | 10/2014 | Kil | H05K 9/0032 361/752 |
| 2015/0062802 A1* | 3/2015 | Grunow | H01L 23/34 361/679.47 |
| 2015/0216081 A1 | 7/2015 | Huang | |
| 2015/0220122 A1 | 8/2015 | Rhee et al. | |
| 2015/0262907 A1* | 9/2015 | Degner | H05K 1/181 361/679.47 |
| 2015/0264842 A1 | 9/2015 | Song et al. | |
| 2015/0342023 A1* | 11/2015 | Refai-Ahmed | H05K 1/0203 361/696 |
| 2015/0342089 A1 | 11/2015 | Kim et al. | |
| 2015/0350392 A1* | 12/2015 | Park | H04M 1/0202 455/575.6 |
| 2016/0120039 A1 | 4/2016 | Bang et al. | |
| 2016/0242271 A1 | 8/2016 | Akimoto | |
| 2017/0098592 A1 | 4/2017 | Jin et al. | |
| 2017/0118865 A1 | 4/2017 | Chang et al. | |
| 2018/0007181 A1 | 1/2018 | Lee et al. | |
| 2020/0100389 A1* | 3/2020 | Park | H04M 1/0262 |

FOREIGN PATENT DOCUMENTS

| | | |
|---|---|---|
| CN | 202979570 U | 6/2013 |
| CN | 203912443 U | 10/2014 |
| CN | 104349637 A | 2/2015 |
| CN | 104813760 A | 7/2015 |
| CN | 104936425 A | 9/2015 |
| CN | 204669802 U | 9/2015 |
| CN | 105188302 A | 12/2015 |
| CN | 105208827 A | 12/2015 |
| CN | 204967873 U | 1/2016 |
| CN | 205005427 U | 1/2016 |
| CN | 205039873 U | 2/2016 |
| DE | 202015100693 U1 | 3/2015 |
| EP | 1 231 639 A1 | 8/2002 |
| EP | 1231639 A1 | 8/2002 |
| JP | 2010-206098 A | 9/2010 |
| JP | 2011-066281 A | 3/2011 |
| KR | 2001-0104439 A | 11/2001 |
| KR | 10-2010-0056732 A | 5/2010 |
| KR | 10-2014-0000933 A | 1/2014 |
| KR | 10-2015-0091873 A | 8/2015 |
| KR | 10-2016-0047823 A | 5/2016 |
| KR | 10-2017-0066990 A | 6/2017 |
| WO | 01/95687 A1 | 12/2001 |
| WO | WO-2018105772 A1 * | 6/2018 ............... H04M 1/02 |

OTHER PUBLICATIONS

Chinese Office Action dated Jun. 19, 2020, issued in Chinese Application No. 201780012181.1.

U.S. Non-Final Office Action dated Apr. 2, 2020, issued in U.S. Appl. No. 15/999,729.

* cited by examiner

ELECTRONIC DEVICE HAVING HEAT COLLECTION/DIFFUSION STRUCTURE

CROSS REFERENCE TO RELATED APPLICATIONS

The present application is a Continuation of Ser. No. 15/999,729 filed on Aug. 20, 2018 which is a Continuation of PCT/KR2017/001599, filed on Feb. 14, 2017 and claims priority to Korean Patent Application No. 10-2016-0019155, which was filed on Feb. 18, 2016, and claims a priority to Korean Patent Application No. 10-2016-0144165, which was filed on Nov. 1, 2016, the contents of which are incorporated herein by reference.

TECHNICAL FIELD

Various embodiments of the present disclosure relate to an electronic device having a heat collection/diffusion structure.

BACKGROUND ART

Electronic devices such as a smart phone or a tablet computer are becoming important means for delivering rapidly changing information. Such electronic devices facilitate a user's work through a Graphical User Interface (GUI) environment using a touch screen, and provides various multimedia media based on a web environment.

In order to provide various functions, electronic devices are equipped with various communication components and electronic components. For example, an electronic device is equipped with a stereo speaker module so as to provide a music listening function using stereo sound. In addition, an electronic device is equipped with a camera module so as to provide a photographing function. Further, an electronic device is equipped with a communication module so as to provide a communication function with other electronic devices through a network.

Moreover, for higher performance electronics, more electronic components are mounted on a printed circuit board in a confined space.

DETAILED DESCRIPTION OF THE INVENTION

Technical Problem

Since the main body of an electronic device is slimmed and a high-specification Application Processor (AP) or the like is used, heat generated from components equipped in the electronic device may increase.

As a heat generation source of an electronic device, a printed circuit board (hereinafter referred to as a "board") on which various electronic components are mounted may be a main heat generation source, relatively high heat is generated from an AP mounted on the board, and heat dissipation from such heat generation components is one of important hardware design considerations.

Various embodiments of the present disclosure may provide an electronic device having a heat collection/diffusion structure of a heat generation component using a heat pipe, among a plurality of components mounted on a board.

Technical Solution

An electronic device according to various embodiments of the present disclosure may include: a housing including a first face that faces a first direction, and a second face that faces a second direction, which is opposite the first direction; a printed circuit board inserted between the first face and the second face; an electronic component disposed on the printed circuit board; a shielding structure including a conductive structure at least partially enclosing the electronic component, the shielding structure being mounted on the printed circuit board; and a heat pipe including a first end and a second end, wherein the first end is thermally coupled to a portion of the shielding structure, and the first end is disposed closer to the shielding structure than the second end.

An electronic device according to various embodiments of the present disclosure may include: a support structure; a printed circuit board including a first face that faces the support structure and a second face opposite the first face; at least one heat generation source disposed on the first face of the printed circuit board; a shielding structure including a conductive structure at least partially enclosing the electronic device, and mounted on the printed circuit board; and a heat pipe disposed on the support structure and having a first end and a second end opposite the first end, wherein the first end is thermally coupled to the heat generation source, so that heat is transferred from the heat generation source.

An electronic device according to various embodiments of the present disclosure may include: a support structure; a printed circuit board including a first face that faces the support structure and a second face opposite the first face; at least one heat generation source disposed on the first face of the printed circuit board; a shielding structure including a conductive structure at least partially enclosing the heat generation source, and mounted on the printed circuit board; a heat pipe disposed on the support structure and having a first end and a second end opposite the first end, wherein the first end is thermally coupled to the heat generation source, and the heat pipe transfers heat of the first portion, which is transferred from the heat generation source, to the second end; and a heat collection device disposed on the support structure and thermally coupled to the heat generation source so as to collect heat, generated from the heat generation source, at the first portion of the heat pipe.

An electronic device according to various embodiments of the present disclosure may include: a housing including a first face that faces a first direction, and a second face that faces a second direction, which is opposite the first direction; a printed circuit board inserted between the first face and the second face; a plurality of heat generation components disposed on the printed circuit board; a shielding structure including a conductive structure at least partially enclosing the electronic device, the shielding structure being mounted on the printed circuit board; a heat pipe including a first portion and a second portion, wherein the first portion is thermally coupled to a portion of the shielding structure, and the first portion is disposed closer to the shielding structure than the second portion; and at least one heat collection/diffusion member disposed between each of the heat generation components and the heat pipe to be thermally coupled thereto so as to collect heat of the heat generation components, or to diffuse heat, transferred via the heat pipe, to a peripheral region.

Advantageous Effects

Various embodiments of the present disclosure may provide an electronic device having a heat collection/diffusion structure of a heat generation component using a heat pipe.

Various embodiments of the present disclosure may provide an electronic device having a heat collection/diffusion structure of a heat generation component by including a heat transfer structure in a shielding structure while maintaining the shielding structure.

Various embodiments of the present disclosure may provide an electronic device having a heat collection/diffusion structure capable of transferring heat to a portion that is relatively cooler than a heat generation component using a metal-made heat collection device or a heat pipe.

MODE FOR CARRYING OUT THE INVENTION

Figure 1A:
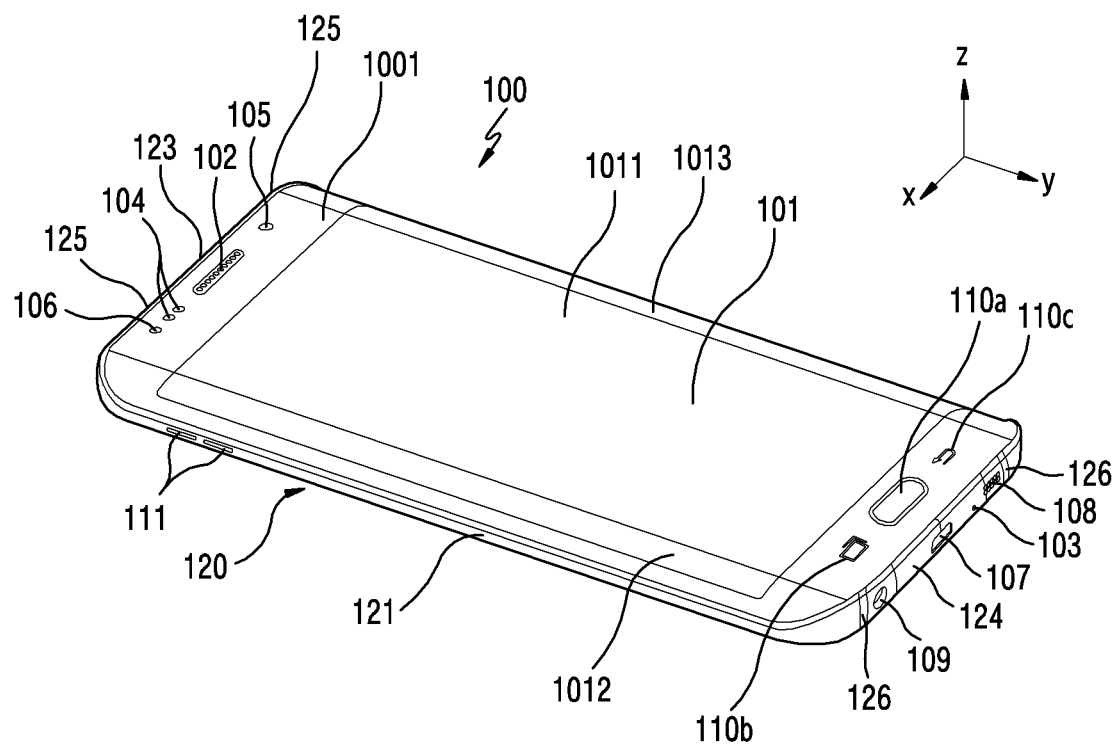
FIG. 1A is a perspective view illustrating the front face of an electronic device according to various embodiments.

Hereinafter, various embodiments of the present invention will be described with reference accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the present invention, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term. "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even if terms are terms which are defined in the specification, they may not be interpreted to exclude embodiments of the present invention.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air condoners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development.

Hereinafter, an electronic device according to various embodiments will be described with reference to the accompanying drawings. Herein, the term "user" may refer to a person who uses an electronic device or a device that uses an electronic device (e.g., an artificial intelligence electronic device).

Figure 1B:
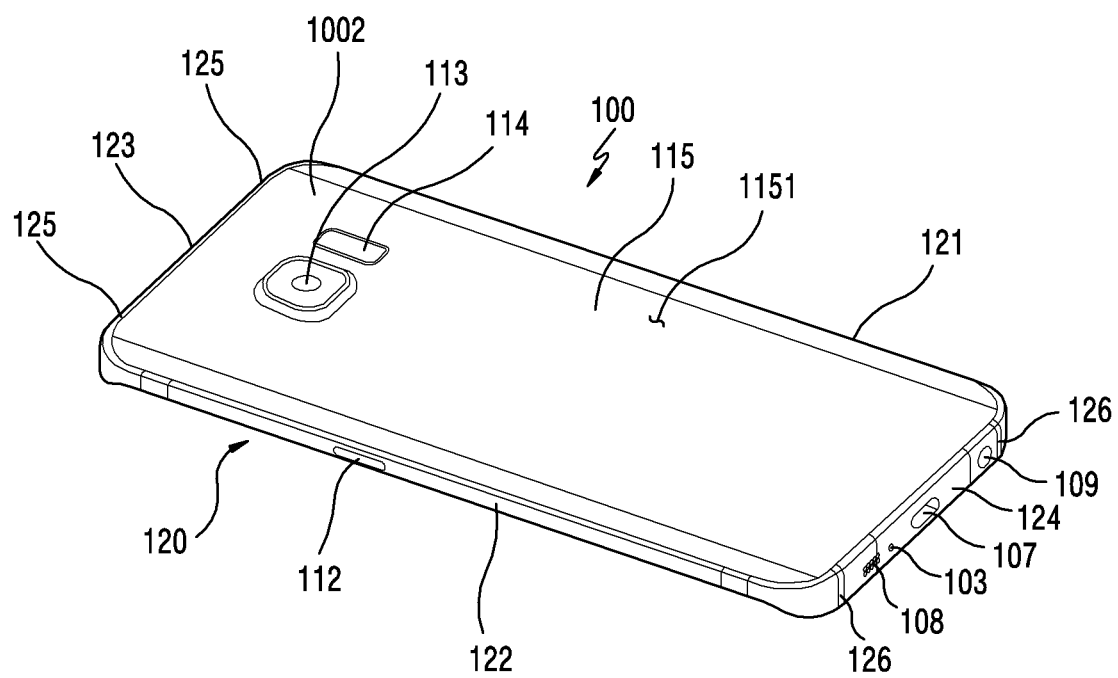
FIG. 1B is a perspective view illustrating the rear face of the electronic device according to various embodiments.
Figure 1C:
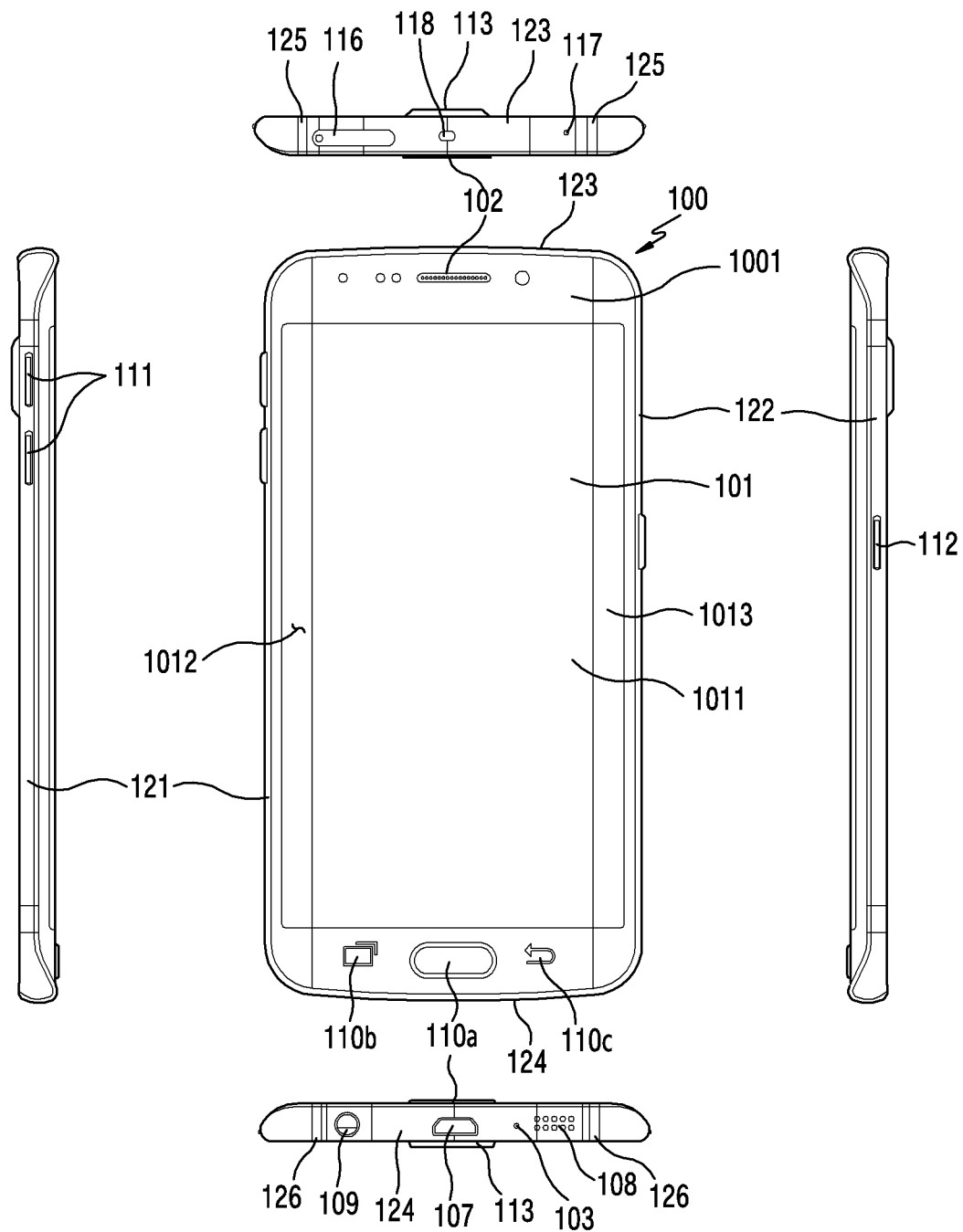
FIG. 1C is a diagram showing six sides of the electronic device according to various embodiments, respectively.

FIG. 1A is a perspective view illustrating the front face of an electronic device according to various embodiments, FIG. 1B is a perspective view illustrating the rear face of the electronic device according to various embodiments, and FIG. 1C illustrates the electronic device according to various embodiments in a state in which the electronic device is viewed from front, upper, lower, left and right sides.

Referring to FIGS. 1A to 1C, an electronic device 100 according to various embodiments may be provided with a display 101 (which may also be referred to as a "touch screen") on the front face 1001 thereof. A receiver 102 may be disposed above the display 101 so as to receive a voice of a communication partner. A microphone 103 may be disposed below the display 101 so as to transmit a voice of the user of the electronic device to the communication partner.

According to various embodiments, components for conducting various functions of the electronic device 100 may be disposed around the receiver 102 in the electronic device 100. The components may include one or more sensor modules 104. The sensor modules 104 may include one or more of, for example, an illuminance sensor (e.g., an optical sensor), a proximity sensor (e.g., an optical sensor), an infrared sensor, and an ultrasonic sensor. According to one embodiment, the components may include a front camera 105. According to one embodiment, the components may include an indicator 106 configured to inform the user of the status information of the electronic device 100.

According to various embodiments, the display device 101 may be formed as a large screen to occupy a greater portion of the front face of the electronic device 100. A main home screen is displayed as the first screen on the display 101 when the electronic device 100 is powered on. In addition, when the electronic device 100 has several pages of different home screens, the main home screen may be the first home screen among the several pages of home screens. The home screen may display shortcut icons to execute frequently used applications, a main menu switching key, time, weather, or the like. The main menu switching key may cause the main screen to be displayed on the display 101. In addition, in the upper end of the display 101, status bars may be formed so as to indicate the statuses of the electronic device 100, such as a battery-charging status, a received signal strength, and the current time. Below the display 101, a home key 110a, a menu key 110b, a back key 110c, and the like may be disposed.

According to various embodiments, the home key 110a may cause the main home screen to be displayed on the display 101. For example, when the home key 110a is touched in the state in which a home screen, other than the main home screen, another home screen, or a menu screen is displayed on the display 101, the main home screen may be displayed on the display 101. In addition, when the home key 110a is touched while applications are executed on the display 101, the main home screen may be displayed on the display screen 101. In addition, the home key 110a may also be used in order to cause the most recently used application or a task manager to be displayed on the display 101. The home key 110a may be deleted from the front portion of the electronic device 100. A fingerprint recognition sensor device may be disposed on the top face of the home key 110a. The home key may be configured to perform a first function (e.g., a home screen return function or a wake-up/sleep function) by an operation of physically pressing the home key button, and to perform a second function (e.g., a fingerprint recognition function) by an operation of swiping the top face of the home key.

According to various embodiments, the menu key 110b may provide a connection menu that may be used on the display 101. For example, the connection menu may include, for example, a widget addition menu, a background screen change menu, a retrieve menu, an edition menu, and an environment setting menu. According to various embodiments, the back key 10c may cause the screen, which has been executed just prior to the currently executed screen, to be displayed, or may cause the most recently used application to be terminated.

According to various embodiments, the electronic device 100 may include a metal frame 120 as a metal housing. The metal frame 120 may be arranged along the rim of the electronic device 100, and may be disposed to expand to at least a partial region of the rear face of the electronic device 100 that extends from the rim. The metal frame 120 may be at least a portion of the thickness of the electronic device 100 along the rim of the electronic device 100, and may be formed in a closed loop shape.

According to various embodiments, the metal frame 120 may be disposed in only a partial region of the rim of the electronic device 100. When the metal frame 120 is a portion of the housing of the electronic device 100, the remaining portion of the housing may be replaced by a non-metallic member. In such a case, the housing may be formed in a manner in which the non-metallic member is molded on the metal frame 120 through insert injection molding. The metal frame 120 includes one or more split portions 125 and 126, so that a unit metal frame separated by the split portions 125 and 126 may be utilized as an antenna radiator. An upper frame 123 may be a unit frame defined by a pair of split portions 125 formed at a predetermined interval. A lower frame 124 may be a unit frame defined by a pair of split portions 126 formed at a predetermined interval. The split portions 125 and 126 may be formed in unison when the non-metallic member is molded on a metal member through insert injection molding.

According to various embodiments, the metal frame 120 may have a closed loop shape along the rim. When viewed from the front side of the electronic device 100, the metal frame 120 may include a left frame 121, a right frame 122, an upper frame 123, and a lower frame 124.

According to various embodiments, various electronic components may be disposed on the lower frame 124. A speaker 108 may be disposed at one side of the microphone 103. At the other side of the microphone 103, an interface connector 107 may be disposed such that a data transmission/reception function by an external device and external power may be applied thereto in order to charge the electronic device 100. An ear jack hole 109 may be disposed at one side of the interface connector 107. All of the above-mentioned microphone 103, speaker 108, interface connector 107, and ear jack hole 109 may be disposed within the region of the unit frame defined by a pair of split portions 126 disposed in the lower frame 124. Without being limited thereto, however, at least one of the above-mentioned electronic components may be disposed within a region that includes the one or more split portions 126, or outside the unit frame.

According to various embodiments, various electronic components may also be disposed on the upper frame 123. A socket device 116 may be disposed on the upper frame 123, so that a card type external device can be inserted into the socket device 116. The socket device 116 may accommodate at least one of an intrinsic ID card for the electronic device (e.g., a SIM card or a UIM card) and a memory card for storage space expansion. An infrared sensor module 118 may be disposed at one side of the socket device 116, and an auxiliary microphone device 117 may be disposed at one side of the infrared sensor module 118. All of the above-mentioned socket device 116, the infrared sensor module 118, and the microphone device 117 may be disposed within the region of the unit frame defined by the pair of split portions 125 disposed in the upper frame 123. Without being limited thereto, however, at least one of the above-mentioned electronic components may be disposed within a region that includes one or more split portions 125 or outside the split portions.

According to various embodiments, at least one first side key button 111 may be disposed on the left frame 121. A pair of first side key buttons 111 may be disposed on the left frame 121 to partially protrude so as to perform a volume up/down function, a scroll function, or the like.

According to various embodiments, at least one second side key button 112 may be disposed on the right frame 122. The second side key buttons 112 may perform a power ON/OFF function, a wake-up/sleep function of the electronic device, or the like.

According to one embodiment, a rear camera 113 may be disposed on the rear face 1002 of the electronic device 100, and at least one electronic component 114 may be disposed at one side of the rear camera 113. For example, the electronic component 114 may include at least one of an illuminance sensor (e.g., an optical sensor), a proximity sensor (e.g., an optical sensor), an infrared sensor, an ultrasonic sensor, a heart rate sensor, and a flash device.

According to various embodiments, the front face 1001 including the display 101 may include a flat portion 1011, and left and right curved portions 1012 and 1013, which are formed on the left and right of the flat portion 1011, respectively. The front face 1001 of the electronic device 100 may use a single window, thereby including a display region 101 and all of the other regions (e.g., a BM region). The left and right curved portions 1012 and 1013 may be formed to extend from the flat portion 1011 in the X-axis direction of the electronic device 100. The left and right curved portions 1012 and 1013 may be lateral side faces of the electronic device 100. In such a case, the left and right curved portions 1012 and 1013 and the left and right metal frames 121 and 122 of the metal frame 120 may form the lateral side faces of the electronic device 100 together. Without being limited thereto, the front face 1001 including the display 101 may include only one of the left and right curved portions 1012 and 1013. The front face 1001 may be configured to include only the left curved portion 1012 along the flat portion 1011, or to include only the right curved portion 1013 along the flat portion 1011.

According to various embodiments, the front face 1001 may include a window 240 (see FIG. 2) including curved portions 1012 and 1013 on the left and right and a flexible display module applied to at least a portion of the lower side of the window. According to one embodiment, a window 130 (see FIG. 3) may be formed in such a manner that the top face and the rear face thereof are both bent (e.g., hereinafter referred to as a "3-D manner"). However, without being limited thereto, the window 130 (see FIG. 3) may be formed in such a manner that the left and right portions of the top face thereof are formed in a curved shape and the rear face thereof is formed as a flat face (hereinafter, referred to as a "2.5D manner"). The window may be formed of a transparent glass material (e.g., sapphire glass) or a transparent synthetic resin material.

According to various embodiments, the electronic device 100 may selectively display information by controlling a display module. The electronic device 100 may control the display module to configure a screen only on the flat portion 1011. The electronic device 100 may control the display module to configure a screen in any one of the left and right curved portions 1012 and 11013 together with the flat portion 1011. The electronic device 100 may control the display module to configure a screen in only one of the left and right curved portions 1012 and 1013, except for the flat portion 1011.

According to various embodiments, the entire rear face 1002 of the electronic device 100 may be formed by one rear external surface mounting member 115. The rear face 1002 may include a flat portion 1151 that is formed substantially in the central portion, and may additionally include or may not include a left curved portion and a right curved portion at the left and right sides of the flat portion 1151.

Figure 2:
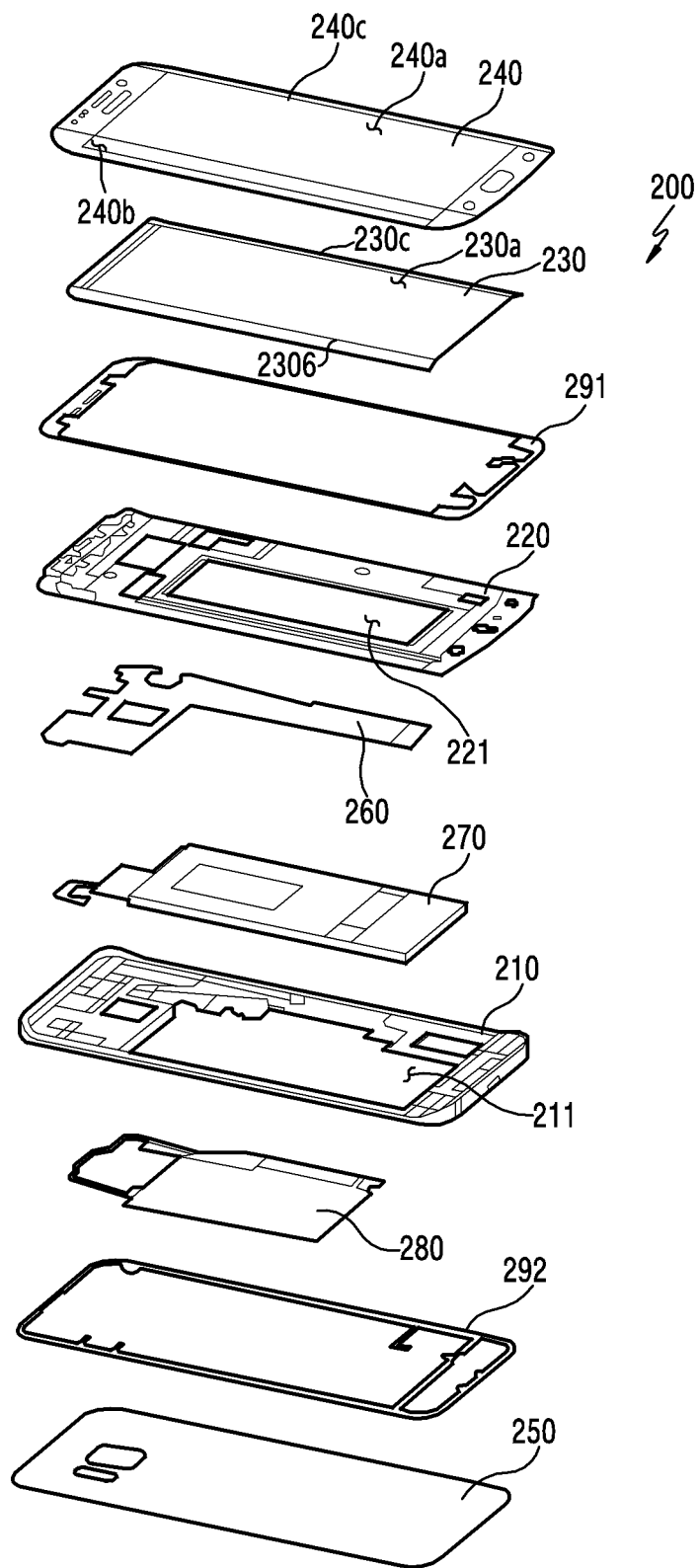
FIGS. 2 and 3 are exploded perspective views each illustrating a configuration of an electronic device according to various embodiments.

FIG. 2 is an exploded perspective view illustrating an electronic device according to various embodiments. The electronic device 200 according to various embodiments may be the same as the electronic device 100 described above.

Referring to FIG. 2, according to various embodiments, the electronic device 200 may include a PCB 260, an inner support structure 220, a display module 230, and a front window 240 (which may be referred to as a first plate facing substantially a first direction) which are disposed in the manner of being sequentially stacked on the upper side of the housing 210.

According to various embodiments, the electronic device 200 may include a wireless power transmission/reception member 280 (which may include a flexible printed circuit board provided with an antenna pattern), and a rear window 250 (which may be referred to as a second plate facing substantially a second direction which is opposite the first direction) which may be disposed in the manner of being sequentially stacked on the lower side of the housing 210.

According to one embodiment, a battery pack 270 may be accommodated in a battery pack accommodation space 211 formed in the housing 210, avoiding the PCB 260. According to one embodiment, the battery pack 270 and the PCB 260 may be disposed in parallel to each other without overlapping with each other.

According to various embodiments, the display module 230 may be fixed to the inner support structure 220, and the front window 240 may be fixed to the inner support structure 220 in the manner of being attached by a first adhesive member 291. According to various embodiments, the rear window 250 may be fixed in the manner of being attached to the housing 210 by the second adhesive member 292. According to various embodiments, the electronic device may include a side member that surrounds at least a portion of a space between the first plate and the second plate.

According to various embodiments, the front window 240 may include a flat portion 240a, and left and right bent portions 240b and 240c bent in the opposite directions from the flat portion 240a. For example, the front window 240 may be positioned on the electronic device 200 so as to form the front face, and may employ a transparent material so as to display a screen displayed on the display module 230. Further, the front window 24 may provide an input/output window for various sensors. According to one embodiment, the left and right bent portions 240b and 240c are illustrated as being formed in a 3D manner. However, the single-bent shapes may also be applied to the upper and lower portions in addition to the left and right bent portions, or dual-bent shapes may also be applied to the upper, lower, left, and right portions. According to one embodiment, a touch panel may be further disposed on the rear face of the front window 240, and may receive a touch input signal from the outside.

According to various embodiments, the display module 230 may be formed in a shape corresponding to that of the front window 240 (a shape having a corresponding curvature). According to one embodiment, the display module 230 may include left and right bent portions 230b and 230c about the flat portion 230a. According to one embodiment, a flexible display module may be used for the display module 230. According to one embodiment, when the rear face of the front window 240 is in the form of a flat window type (hereinafter, referred to as a "2D form" or "2.5D form"), the rear face of the front window 240 is flat, and as a result, an ordinary Liquid Crystal Display (LCD) or an On-Cell TSP AMOLED (OCTA) may be applied.

According to various embodiments, the first adhesive member 291 is a component for securing the front window 240 to the inner support structure (e.g., a bracket) 220 disposed inside the electronic device. The first adhesive member 291 may be a kind of tape, such as a double-sided tape, or a liquid adhesive layer, such as a glue. For example, when a double-sided tape is applied as the first adhesive member 291, as an inner substrate, a general PET (polyethylene terephthalate) material may be applied or a functional substrate may be applied. For example, it is possible to strengthen impact resistance by using a foam tape or a substrate using an impact resistant fabric in order to prevent the front window from being damaged by external impact.

According to various embodiments, the inner support structure 220 may be disposed within the electronic device 200, and may be used as a component for reinforcing the overall rigidity of the electronic device. For example, at least one metal of Al, Mg, and STS may be used for the inner support structure 220. According to one embodiment, for the inner support structure 220, a high-rigidity plastic containing glass fiber may be used, or a metal and a plastic may be used together. According to one embodiment, when a metal material and a non-metal material are used together as the material of the inner support structure 220, the inner support structure 220 may be formed in the manner of molding the non-metal material on the metal material through insert injection molding. The inner support structure 220 is positioned on the rear face of the display module 230. The inner support structure 22 may have a shape (curvature) similar to that of the rear face of the display module 230, and may support the display module 330. According to one embodiment, between the inner support structure 220 and the display module 230, a sheet (e.g., an elastic member such as rubber or sponge, or an adhesive layer such as double-sided tape or single-sided tape) may be additionally disposed so as to protect the display module 230.

According to various embodiments, the electronic device 200 may further include an auxiliary device for reinforcing the internal rigidity or improving a thermal characteristic, an antenna characteristic, or the like by adding a metal or composite material in the form of a sheet material to a hole region 221 as needed.

According to various embodiments, the inner support structure 220 may be fastened to the housing (e.g., the rear case) 210 in order to form a space therein, and one or more electronic components may be disposed in such a space. The electronic components may include the PCB 260. Without being limited thereto, however, an antenna device, a sound device, a power supply device, a sensor device, and the like may be included in addition to the PCB 260.

According to various embodiments, the battery pack 270 may supply power to the electronic device 200. According to one embodiment, one face of the battery pack 270 is adjacent to the display module 230, and the other face is adjacent to the rear window 250. Thus, when the battery pack 270 swells during charging, the counterpart products may be deformed or damaged. In order to prevent this, it is possible to protect the battery pack 270 by providing predetermined spaces (swelling gaps) between the battery pack 270 and the counterpart products (e.g., the display module 230 and the rear window 250). According to one embodiment, the battery pack 270 may be integrally disposed in the electronic device 200. However, the present disclosure is not limited thereto, and when the rear window 250 is implemented to be detachable from the electronic device 200, the battery pack 270 may be implemented to be detachable.

According to various embodiments, the housing 210 may form the exterior (e.g., the side face including a metallic bezel) of the electronic device 200, and may be coupled with the inner support structure 220 so as to form an interior space. According to one embodiment, the front window 240 may be disposed on the front face of the housing 210, and the rear window 250 may be disposed on the rear face of the housing 21. However, without being limited thereto, the rear face may be variously implemented using an injection-molded synthetic resin, a metal, a composite of a metal and a synthetic resin, and the like. According to one embodiment, the gap between the housing 210 and the internal structure formed by the rear window 250 may prevent the rear window 250 from being damaged by secondary impact caused by the internal structure when external impact, such as the drop of the electronic device, occurs.

According to various embodiments, the wireless power transmission/reception member 280 may be disposed on the rear face of the housing 210. According to one embodiment, the wireless power transmission/reception member 280 is attached to one face of an internal mounting component or to a partial region of the inner face of the housing 210, particularly a region generally adjacent to the rear window 250, in the form of a thin film, and includes a structure that forms a contact with the PCB 260 therein. According to one embodiment, the wireless power transmission/reception member 280 may be embedded or attached as a portion of a housing 210 or a component, such as the battery pack 270, and may be provided in the form of being simultaneously attached to both of the component and the housing 210.

According to various embodiments, the second adhesive member 292 is a component for fixing the rear window 250 to the housing 210, and may be applied in a form similar to the above-described first adhesive member 291.

According to various embodiments, the rear window 250 may be applied in a form similar to the front window 240 described above. According to one embodiment, the front face (the face exposed to the outside) of the rear window 250 may be formed in a curvature in which an inclined angle increases toward the left and right ends. According to one embodiment, the rear face of the rear window 250 is formed as a flat face, and may be bonded to the housing 210 by the second adhesive member 292.

Figure 3:
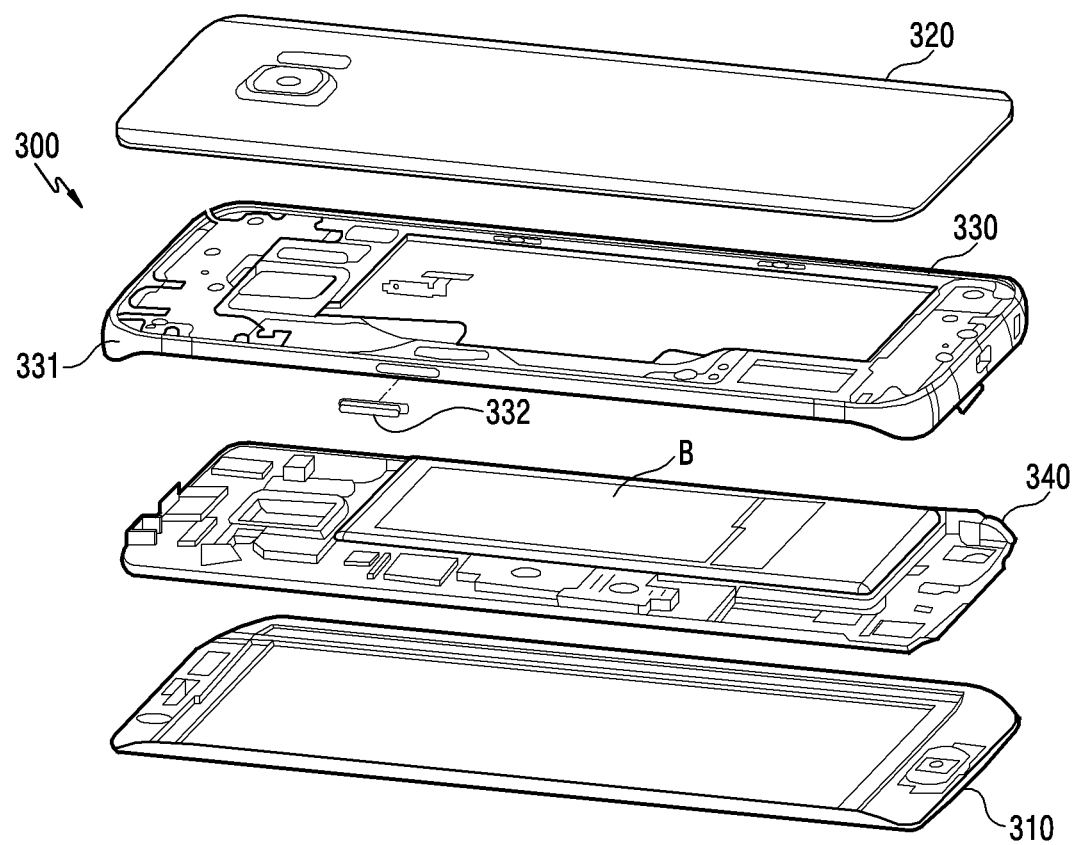

FIG. 3 is an exploded perspective view illustrating a main configuration of the electronic device according to various embodiments.

Referring to FIG. 3, the electronic device 300 according to various embodiments may have at least one member related to the appearance on the external face thereof. For example, over a great part of the external appearance of the electronic device 300, exterior members, such as a front cover 310, a rear cover 320, a case 330 including side walls 331 located on a lateral side, may be disposed. In addition, in the external appearance of the electronic device 300, a home key, a receiver, or the like may be disposed on the front face of the electronic device 300, a rear camera, a flash, or a speaker may be disposed on the rear face of the electronic device 300, and a plurality of physical keys, a connector or a microphone hole may be disposed in the side walls 331.

In the electronic device 300 according to various embodiments, it may be necessary to configure the members disposed on the exterior of the electronic device so as to prevent foreign matter, such as water in the external environment, from penetrating into the inside of the electronic device. The electronic device 300 according to various embodiments may include a front cover 310, a back cover 320, a case 330, a structure 340, and a waterproofing structure.

According to various embodiments, the front cover 310 may form the front face of the electronic device 300, and may form the exterior appearance of the front face of the electronic device 300. The front cover of the electronic device 300 according to various embodiments may be made of a transparent member. For example, the transparent member may include transparent synthetic resin or glass. The display supported on the structure may include a screen region exposed through the front cover.

According to various embodiments, the rear cover 320 may form the rear face of the electronic device 300, and may form the external appearance of the rear face of the electronic device 300. According to various embodiments, the rear cover 320 of the electronic device 300 may be configured as a transparent or opaque member. For example, the transparent member may include a transparent synthetic resin or glass, and the opaque member may be made of a material, such as a translucent or opaque synthetic resin or a metal.

According to various embodiments, the side wall 331 of the case 330 may form the rim side face of the electronic device 300, and may form the external appearance of the side face. According to various embodiments, the side wall 331 of the electronic device may be made of a conductive material, i.e. may be configured as a conductive side wall. For example, the side wall may be made of a metal material, so that the side wall may operate as an antenna radiator. According to various embodiments, the side wall 331 may surround at least a portion of the space provided by the front cover 310 and the rear cover 320. According to various embodiments, the side wall 331 may be formed integrally with a conductive structure or a non-conductive structure.

In the electronic device 300 according to various embodiments, an inner space defined by the front cover 310, the rear cover 320, and the side wall 331 may be divided into a first space and a second space by the rear case 330. With respect to the rear case 330, the inner space may be divided into a first space at the rear cover 320 side and a second space at the front cover 310 side.

According to various embodiments, there may be provided a plurality of inner support structures 340, in which a first structure may be configured to support the display, a board, and the like and a second structure may be configured to support an exterior member. For example, a structure may be configured to be capable of supporting and protecting other components, such as the battery B. According to various embodiments, the inner support structure 340 may be made of a synthetic resin, a metal, or a combination thereof, and may also be made of a metal alloy containing magnesium.

Hereinafter, a structure for improving the heat dissipation of a heat generation component among a plurality of components mounted on a board of an electronic device will be described.

Figure 4:
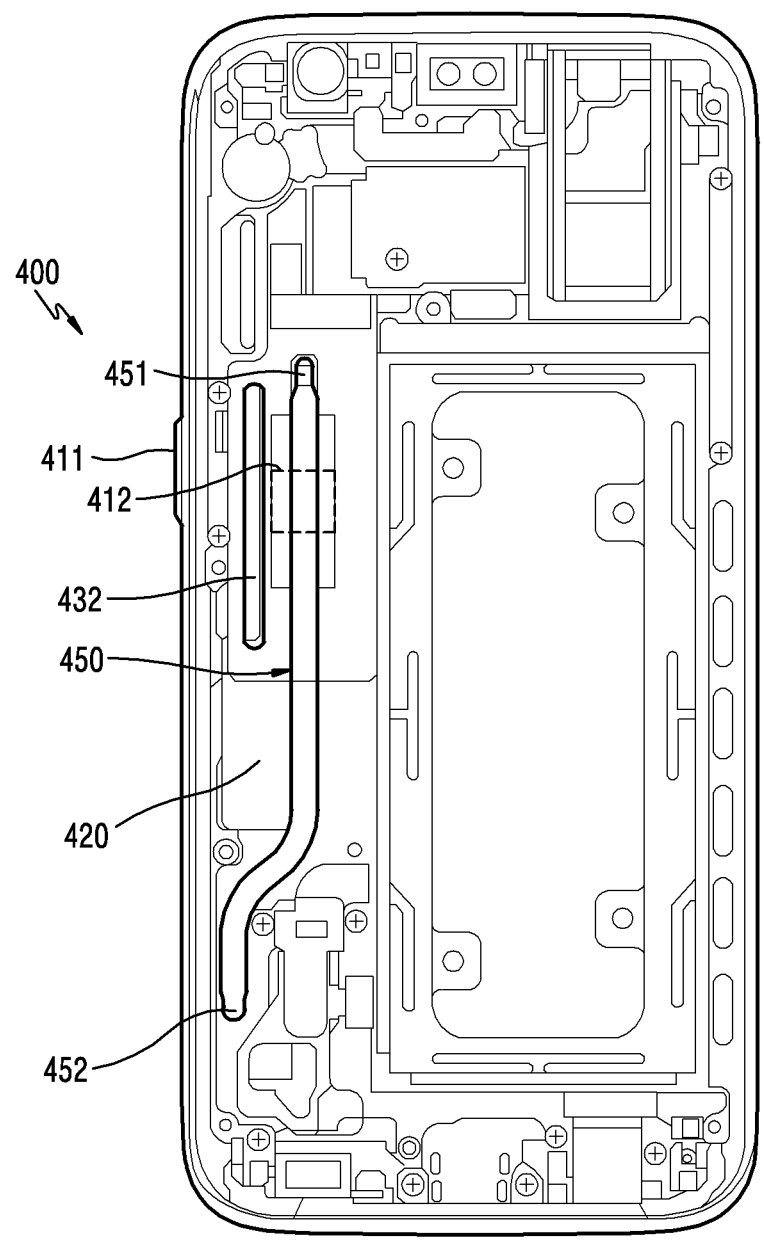
FIG. 4 is a plan view illustrating a state in which a heat pipe according to various embodiments of the present disclosure is disposed in an electronic device.

FIG. 4 is a plan view illustrating a state in which a heat pipe according to various embodiments of the present disclosure is disposed in an electronic device.

Referring to FIG. 4, an electronic device 400 according to various embodiments may employ a heat pipe 450 mounted on an inner support structure 420 in order to cool the temperature of a heat generation source 412. For example, the heat pipe 450 may perform functions of transferring heat from the heat generation source 412 in a relatively hot zone to a low temperature region having a relatively low temperature, diffusing a heat transfer path to a region around the heat pipe 450, and distributing the heat to a region away from the region around the heat pipe 450. The heat pipe 450 may be a heat transfer member capable of transferring a large amount of heat to a relatively low temperature region using a fluid having a high specific heat.

According to various embodiments, the heat pipe 450 may have one end 451, which may be disposed adjacent to the heat generation source 412 which is a high temperature region, and the other end 452, which may be disposed in a low temperature region which is spaced away from the high temperature region. In the heat pipe 450 according to various embodiments, the heat generation source 412, which is a high-temperature region, may be disposed in a remaining portion of the heat pipe 450, except for the one end 451 and the other end 452.

The heat pipe 450 may be a heat transfer path, a heat transfer diffusion path, or a heat dispersion path. According to various embodiments, the heat pipe 450 may be configured in various shapes, in which a portion of the heat pipe 450 should be disposed close to the heat generation source 412 and another portion of the heat pipe 450 should be disposed in a low temperature region having a temperature lower than that of the heat generation source 412.

According to various embodiments, the heat pipe 450 should not transmit heat to another component 411 disposed in the vicinity thereof while transferring heat. To this end, the electronic device 400 according to various embodiments may have a heat transfer prevention structure 432 configured to prevent heat, generated by the heat pipe 450, from being transferred.

According to various embodiments, the electronic device 400 may include a component 411, e.g., a data input device, located near the heat generation source 412. The data input device may be a side input device, which may be an external component that may be disposed to be visible outside the electronic device 400. For example, the data input device may be a first side key button device or a second side key button device of the electronic device 400. However, a component disposed near the heat generation source 412 and within a region affected by the heat from the heat pipe 450 may also have a heat transfer protection structure.

The heat transfer prevention structure 432, which prevents heat, generated by the heat pipe 450 according to various embodiments, from being transferred, may include at least one opening formed in the inner support structure 420. Hereinafter, the heat transfer prevention structure 432 may be referred to as an "opening."

The opening 432 according to various embodiments may extend beyond the length of the region in which the component 411 is located. For example, heat transferred via the heat generation source 412 may be diffused into the peripheral region to reach the component 411 while passing through the heat pipe 450. However, the heat transfer path may be blocked by the opening 432, so that heat transfer from the component 411 can be blocked. For example, the openings 432 may be configured in a slit or slot shape.

Figure 5:
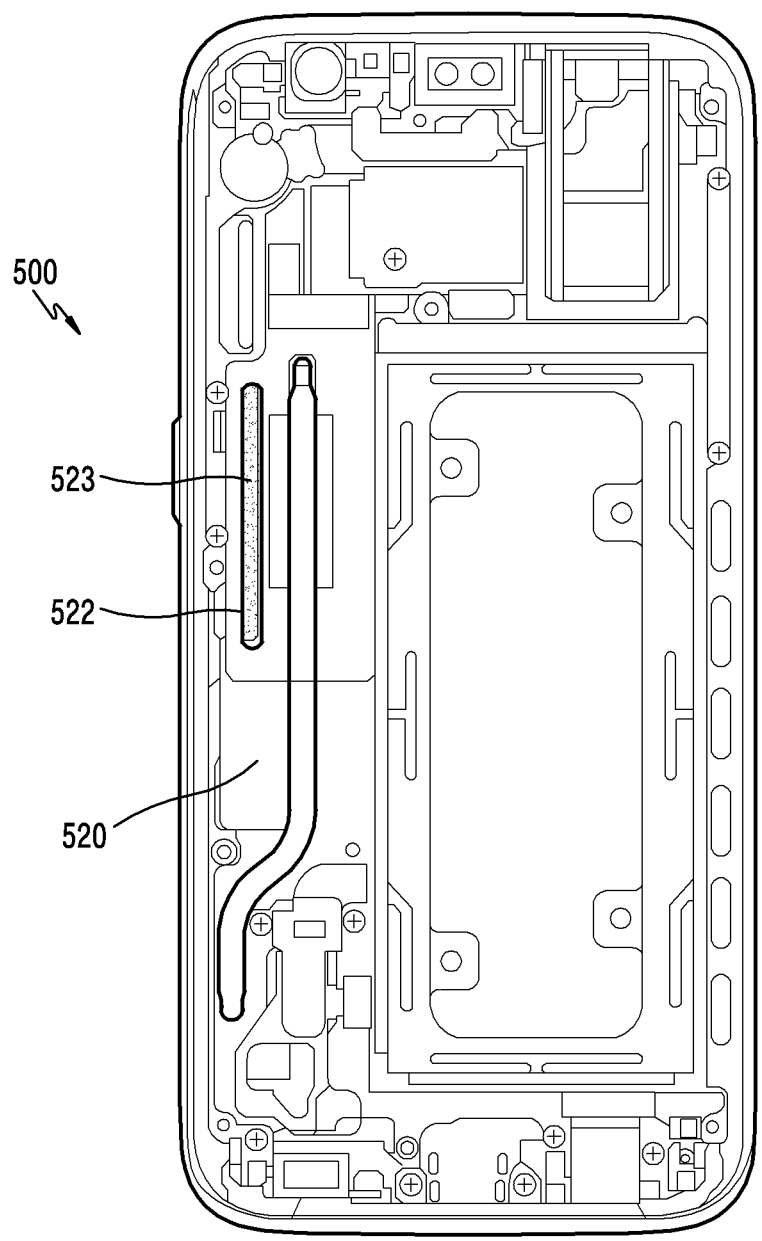
FIG. 5 is a plan view illustrating a state in which a heat pipe according to various embodiments of the present disclosure is disposed in an electronic device.

FIG. 5 is a plan view illustrating a state in which a heat pipe according to various embodiments of the present disclosure is disposed in an electronic device.

Referring to FIG. 5, an electronic device 500 according to various embodiments may be the same as each of the electronic devices 100, 200, and 300 illustrated in FIGS. 1A to 1C, FIG. 2, and FIG. 3. The electronic device 500 according to various embodiments is different from the electronic device 400 illustrated in FIG. 4 in the configuration of an opening 522, but is the same as the electronic device 400 in the remaining configuration. Thus, descriptions of the remaining configuration will be omitted. The opening 522 formed in the inner support structure 520 of the electronic device according to various embodiments may include a material 523 having a low heat transfer rate. For example, the material 523 may include an insulating material such as a synthetic resin.

Figure 6:
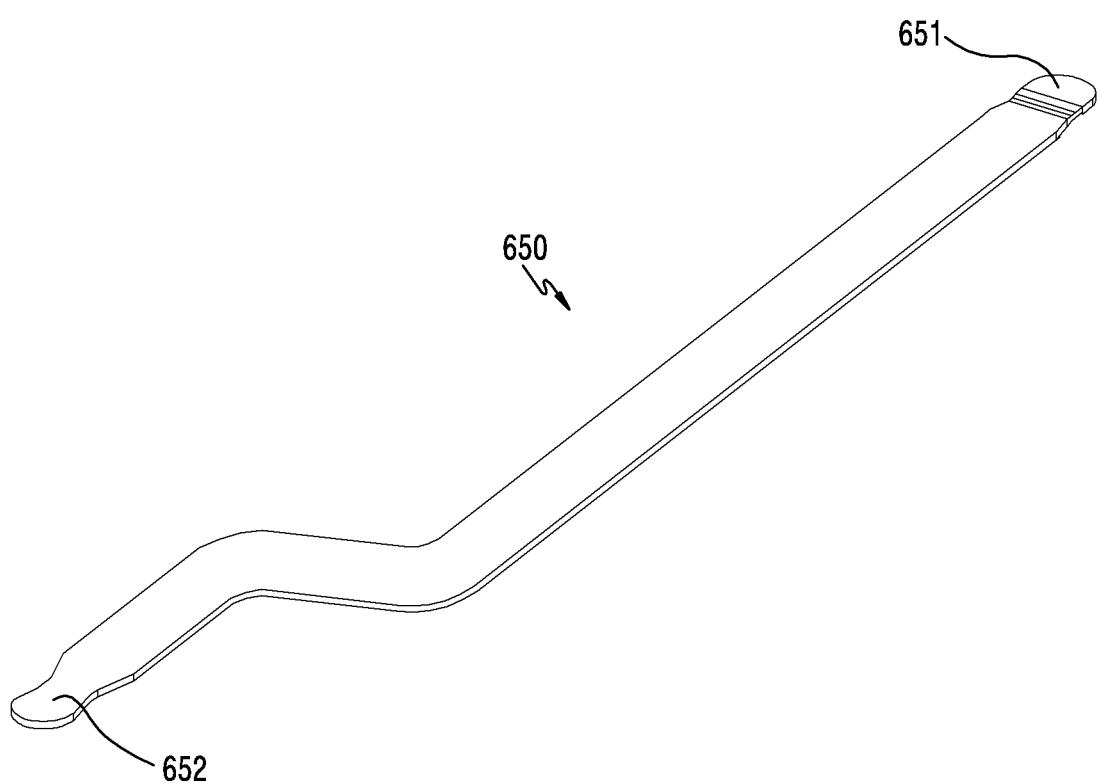
FIG. 6 is a perspective view illustrating a heat pipe according to various embodiments of the present disclosure.

FIG. 6 is a perspective view illustrating a heat pipe according to various embodiments of the present disclosure.

Referring to FIG. 6, the heat pipe 650 according to various embodiments may be the same as the heat pipe 450 illustrated in FIG. 4. According to various embodiments, the heat pipe 650 may include first and second portions, i.e. a first end 651 and a second end 652. The first portion 651 may be one end of the heat pipe 650, and the second portion 652 may be the other end of the heat pipe 650.

The heat pipe 650 according to various embodiments may be configured in various shapes. An important point is that the first end 651 may be disposed close to the heat generation source and the second end 652 may be disposed in a region that is somewhat spaced apart from the heat generation source and has a relatively lower temperature than the heat generation source. By disposing such a heat pipe 650 in the electronic device, the temperature of the heat generation source can be dispersed to a relatively low temperature region.

The heat pipe 650 according to various embodiments may be formed to have a flat cross-sectional shape in order to maximize an adhesion surface with the heat generation source.

The heat pipe 650 according to various embodiments may contain a small amount of working fluid in a vacuum-treated pipe and may absorb heat from a heat generation portion such that the working fluid can be vaporized. The vaporized fluid can be moved by the vapor pressure to a condensation portion and can transfer heat to the outside from the condensation portion. Then, the fluid can be liquefied. The liquefied fluid can be returned to the heat generation portion by a capillary force due to a micro-structure within the tube, and the heat pipe may have a structure in which the working fluid can transfer heat while repeating vaporization and liquefaction.

Figure 7A:
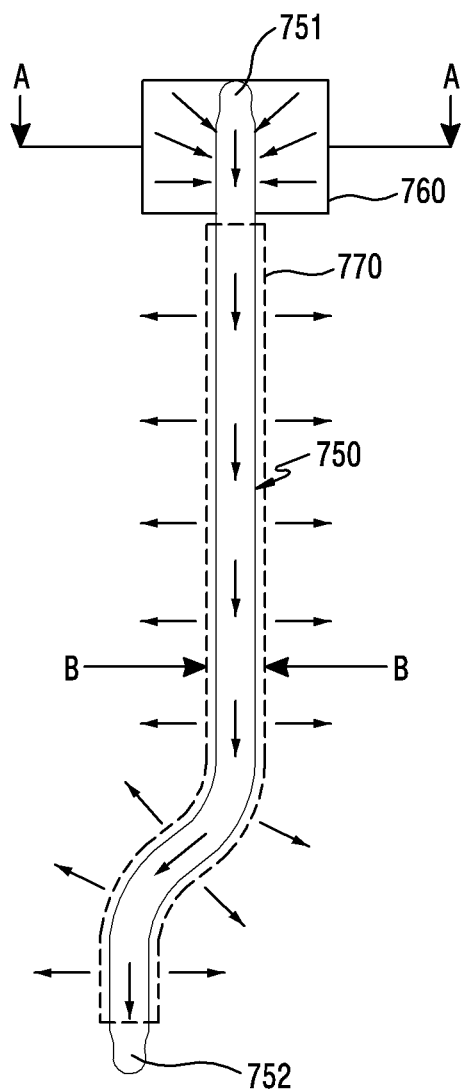
FIG. 7A is an exemplary view illustrating a heat transfer flow of a heat pipe, to which a heat collection device according to various embodiments of the present disclosure is coupled.
Figure 7B:
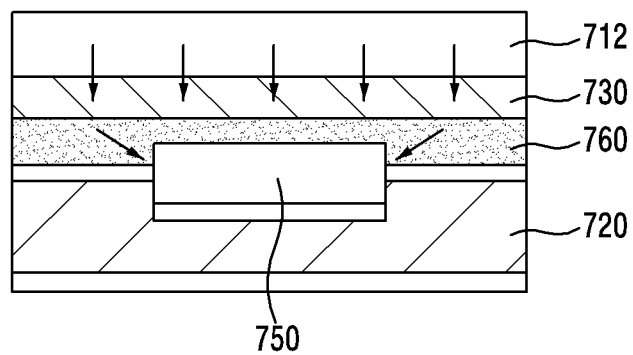
FIG. 7B is a cross-sectional view taken along line A-A in FIG. 7A.
Figure 7C:
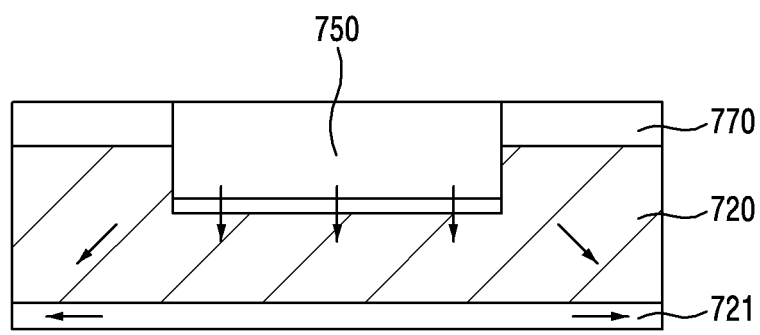
FIG. 7C is a cross-sectional view taken along line B-B in FIG. 7A.

FIG. 7A is an exemplary view illustrating a heat transfer flow of a heat pipe, to which a heat collection device according to various embodiments of the present disclosure is coupled. FIG. 7B is a cross-sectional view taken along line A-A in FIG. 7A. FIG. 7C is a cross-sectional view taken along line B-B in FIG. 7A.

Referring to FIGS. 7A to 7C, a heat pipe 750 according to various embodiments of the present disclosure may further include a heat collection device 760 configured to collect heat generated from the heat generation source 712. For example, the heat collection device 760 may be disposed between the heat generation source and the heat pipe 750, and may transfer the heat of the heat generation source to the heat pipe 750. The heat collection device 760 may perform a heat diffusion function in addition to the heat collection function. The heat collection or heat diffusion function may be a part of the heat transfer function and may be a heat dissipation function that transfers heat in a relatively high temperature region to a low temperature region.

The heat collection device 760 according to various embodiments may have a structure or a shape for transferring the heat generated from the heat generation source to the heat pipe 750. The heat generation source (e.g., an AP) may have a chip shape, the top face of which may have a rectangular or square shape, and the heat collection device 760 bonded to the top face may also have the rectangular or square shape. The heat collection device 760 according to various embodiments may have a face substantially the same as or slightly smaller than the top face of the heat generation source.

The heat collection device 760 according to various embodiments includes a metal material, and may be made of a material having an excellent thermal conductivity, such as copper. One end 751 of the heat pipe may be disposed in the heat collection device 760, and the heat collection device 760 and the one end 751 of the heat pipe may be provided with a coupling structure such that the heat collection device and the one end are in contact with each other as wide an area as possible. The heat collected by the heat collecting device 760 may be transferred to the one end 751 of the heat pipe and then to the other end 752 of the heat pipe end. The arrows may indicate the heat transfer direction. Heat transferred to the heat pipe 750 may be transferred to the support structure 720 in a direction away from the heat pipe 750. The heat transferred to the support structure 720 may be transferred to a metal plate 721 such as copper. A shielding sheet 770 may be attached to the top face of the heat pipe 750.

Figure 8A:
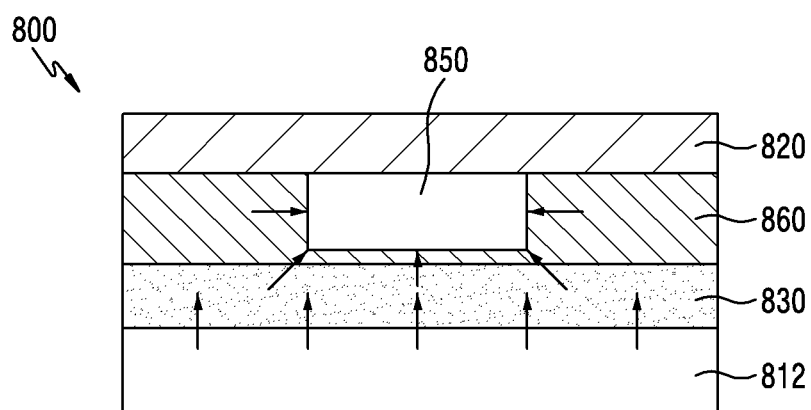
FIG. 8A is a cross-sectional view illustrating a heat transfer structure of a heat pipe, to which a heat collection device according to various embodiments of the present disclosure is coupled.
Figure 8B:
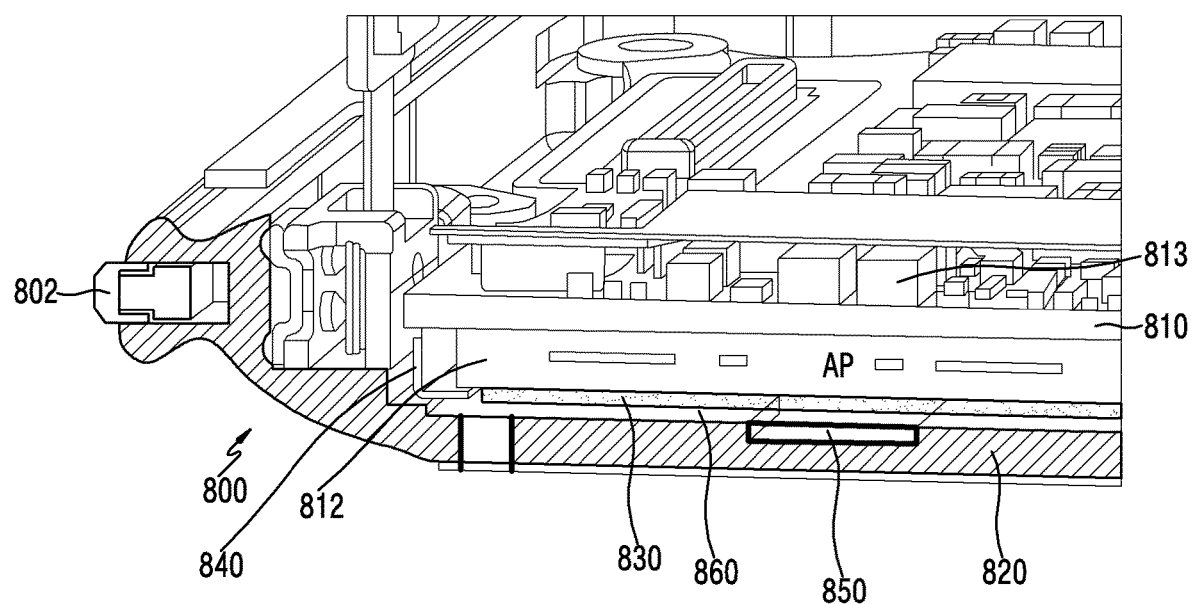
FIG. 8B is a view illustrating an electronic device, in which the heat pipe to which the heat collection device according to various embodiments of the present disclosure is coupled, is disposed.
Figure 8C:
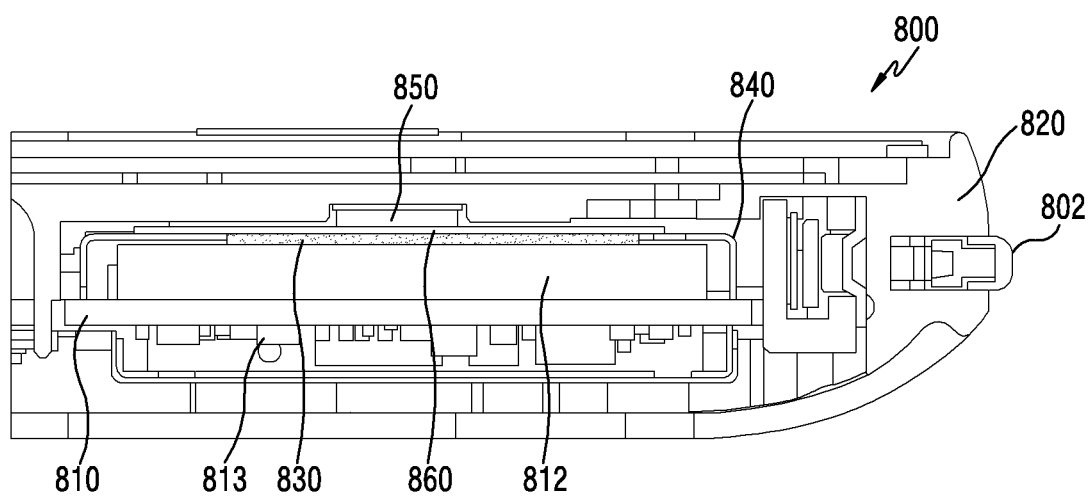
FIG. 8C is a cross-sectional view illustrating the electronic device, in which the heat pipe to which the heat collection device according to various embodiments of the present disclosure is coupled, is disposed.

FIG. 8A is a cross-sectional view illustrating a heat transfer structure of a heat pipe, to which a heat collection device according to various embodiments of the present disclosure is coupled. FIG. 8B is a view illustrating an electronic device, in which the heat pipe to which the heat collection device according to various embodiments of the present disclosure is coupled, is disposed. FIG. 8C is a cross-sectional view illustrating the electronic device, in which the heat pipe to which the heat collection device according to various embodiments of the present disclosure is coupled, is disposed.

Referring to FIGS. 8A to 8C, an electronic device 800 according to various embodiments may be the same as the electronic device 400 illustrated in FIG. 4. In addition, the heat pipe 850 according to various embodiments may be the same as the heat pipe 650 illustrated in FIG. 6. A heat collection device 860 according to various embodiments of the present disclosure may be the same as the heat collection device 760 illustrated in FIG. 7.

The electronic device 800 according to various embodiments may include a first electronic component 812 disposed on a first face of a board 810 that faces a first direction, a second electronic component 813 disposed on a second face of the board 810 that faces a second direction opposite the first direction, and an inner support structure 820 configured to support the board 810. The electronic device 800 according to various embodiments may have a side key button 802 disposed in a third direction perpendicular to the first and second directions. The first electronic component 812 is a heat generation source that generates heat, and may be disposed to be surrounded by a shielding structure 840.

The electronic device 800 according to various embodiments may include a heat transfer material 830, a heat collection device 860, and a heat pipe 850 in order to dissipate the heat generated from the heat generation source 812 to a relatively low temperature region. In addition, the heat pipe 850 according to various embodiments may be the same as the heat pipe 650 illustrated in FIG. 6. The heat collection device 860 according to various embodiments of the present disclosure is a heat transfer device, which may be the same as the heat collection device 760 illustrated in FIG. 7.

The heat generation source 812 according to various embodiments may be of a chip type and may include an Application Processor (AP), a Central Processor (CP), a Power Amplifier (PA) of a Radio Frequency (RF) unit, and the like mounted on the board.

The electronic device 800 according to various embodiments may further include a Thermal Interfacing Material (TIM) 830 for transferring the heat of the heat generation source 812 to the heat collection device 860.

The TIM 830 according to various embodiments may include a single layer or a multi-layer. For example, the TIM 830 may have a constant thickness and may be opaque. According to one embodiment, the TIM 830 may have thermal conductivity. For example, the TIM 830 may have thermal conductivity of 1 W/mk or more (e.g., 4 W/mk). In addition, the TIM 830 may or may not have electrical conductivity. For example, when the TIM 830 has electrical conductivity, the TIM 830 is capable of blocking electrical noise or Electro-Magnetic Interference (EMI). Alternatively, the TIM 830 may have excellent abrasion resistance or heat resistance. Alternatively, the TIM 830 may contain a thermoplastic material.

The TIM 830 according to various embodiments may include a Phase Change Material (PCM). The PCM is changeable from a solid phase to a liquid phase by heat. Here, a liquid PCM may have viscosity. Alternatively, the liquid PIM may be compressible or incompressible. In addition, the TIM 830 may include a material that changes at least one physical property by heat. For example, the TIM can have high viscosity by heat.

The TIM 830 according to various embodiments has a mechanical property (e.g., tensile strength or elasticity), may be resistant against tearing, and may be cured upon being heated.

The TIM 830 according to various embodiments may be shaped in a manner of performing a surface treatment with a thermally conductive material (e.g., silicon, silicone polymer, graphite, or acrylic). The surface treatment method may increase the bonding force between the top face of the TIM and the thermally conductive material. The TIM 830 according to various embodiments may contain silicone polymer.

The electronic device 800 according to various embodiments may have a structure in which the heat generation source 812, the TIM 830, and the heat collection device 860 are stacked in a vertical direction. In addition, at least a portion of the heat pipe 850 may be disposed to be accommodated in the heat collection device 860. The heat generation source 812 and the TIM 830 may be directly bonded to each other in a vertically stacked structure, the TIM 830 and the heat collection device 860 are directly bonded to each other in a stacked structure, the heat collection device 860 and the heat pipe 850 may be directly bonded to each other, and the heat collection device 860 including the heat pipe 850 may be directly bonded to the inner support structure 820 (which may also be referred to as a mid-plate) so as to be accommodated. Instead of the direct bonding, stacking may be performed using soldering, an adhesive layer, or a mechanical bonding structure.

Hereinafter, a heat pipe mounting structure associated with a shielding structure will be described.

Figure 9:
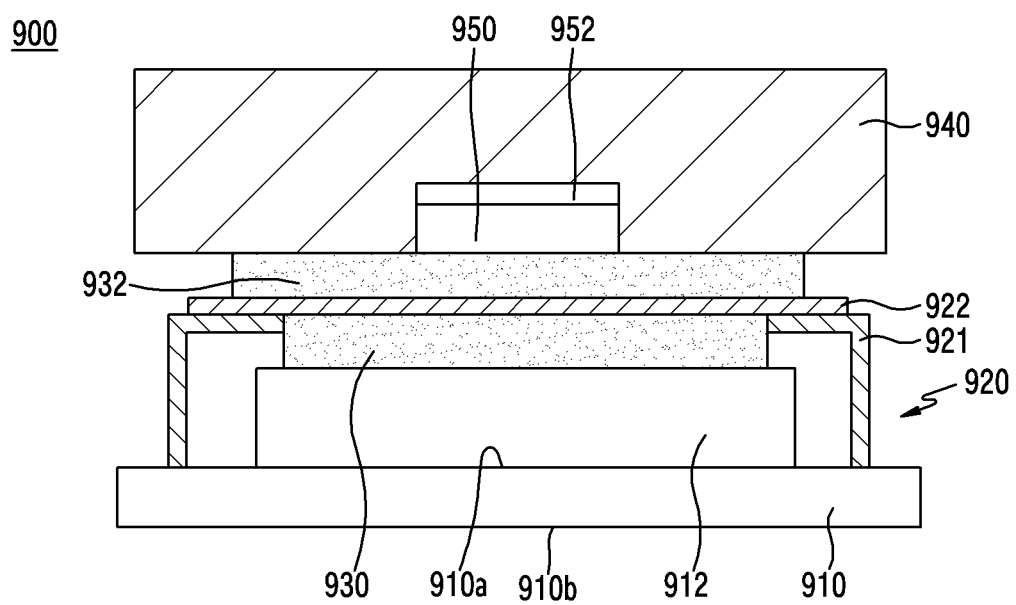
FIGS. 9 to 14 are cross-sectional views each illustrating an electronic device in which a heat transfer structure is applied to a shielding structure according to various embodiments of the present disclosure in a stacked form.

FIG. 9 is cross-sectional view illustrating an electronic device in which a heat transfer structure is applied to a shielding structure according to various embodiments of the present disclosure in a stacked form.

Referring to FIG. 9, an electronic device 900 according to various embodiments may include a board 910, a heat generation source 912, a shielding structure 920, TIMs 930 and 932, and a heat pipe 950. The electronic device 900 according to various embodiments may be the same as the electronic device 400 illustrated in FIG. 4. In addition, the heat pipe 950 according to various embodiments may be the same as the heat pipe 650 illustrated in FIG. 6.

The electronic device 900 according to various embodiments may have a structure in which heat generated from the heat generation source 912 is transferred by the heat pipe 950 through the TIMs 930 and 932. The heat transfer structure is applied to the shielding structure 920, so that the heat generated from the heat generation source 912 can be transferred to the heat pipe 950 via the shielding structure 920.

The board 910 according to various embodiments may include a first face 910a facing the first direction and a second face 910b facing the second direction opposite the first face 910a. The board 910 may have various electronic components mounted on each of the first and second faces 910a and 910b. When the electronic components are in operation, the board 910 may become a heat generation source. The heat generation source 912 may be mounted on the first face 910a of the board according to various embodiments. For example, the heat generation source 912 may be of a chip type and may include an AP, a CP, a PA of an RF unit, or the like.

The shielding structure 920 according to various embodiments may be a device for shielding electromagnetic waves generated from the heat generation source 912 and may include a shield can for shielding EMI. The shielding structure 920 may be disposed to enclose the side faces and the top face of the heat generation source 912. The shielding structure 920 may include a shield frame 921 configured to enclose the side faces of the heat generation source 912 and a shield cover 922 configured to cover the shield frame 921. The shield cover 922 may be coupled to close the top face of the shield frame 921. The shield cover 922 may be a plate including a thin metal material and may include a shield film or a shield sheet. The shield cover 922 may include a metal material, and may include a material such as copper that is excellent in thermal conductivity and is capable of preventing static electricity.

The TIM according to various embodiments may include a first TIM 930, which is a liquid phase or is near the liquid phase and a second TIM 932, which is a solid phase or is near the solid phase.

The first TIM 930 according to various embodiments may be disposed between the top face of the heat generation source 912 and the bottom face of the shield cover 922. Since the first TIM 930 is a material, which is a liquid phase or is near the liquid phase, it is possible to increase the degree of close contact with the top face of the heat generation source 912 compared with the second TIM 932, which is a solid phase. The top face of the heat generation source 912 and the first TIM 930 should be in close contact with each other in order to increase the thermal conductivity, so that the heat generated from the heat generation source 912 can be transferred to the first TIM 930.

The second TIM 932 according to various embodiments may be disposed between the top face of the shield cover 922 and the bottom face of the heat pipe 950. The second TIM 932 may be a material, which is a solid phase or is near the solid phase, and may serve to transfer the heat, transferred from the shield cover 922, to the heat pipe 950. In addition, the second TIM 932 may transfer the heat, transferred from the shield cover 922, to the inner support bracket 940, thereby performing an additional transfer function. Because the inner support structure 940 is a low temperature region, the heat, transferred from the second heat transfer material 932, can be transferred to the heat pipe 950 and transferred to the inner support bracket 940. In addition, the heat, transferred to the inner support structure 940, can be transmitted back to the heat pipe 950. For example, the inner support structure 940 may include a bracket.

In the electronic device 900 according to various embodiments, the first TIM 930 may be bonded on the heat generation source 912 in a vertically stacked form, the shield cover 922 may be bonded on the first TIM 930 in a vertically stacked form, the second TIM 932 may be disposed on the shield cover 922 in a vertically stacked form, and the heat pipe 950 and the inner support structure 940 may be disposed on the second TIM 932 in a vertically stacked form. Respective layers can be densely bonded to each other. Reference numeral 952 may denote a piece of tape as an adhesive layer.

Figure 10:
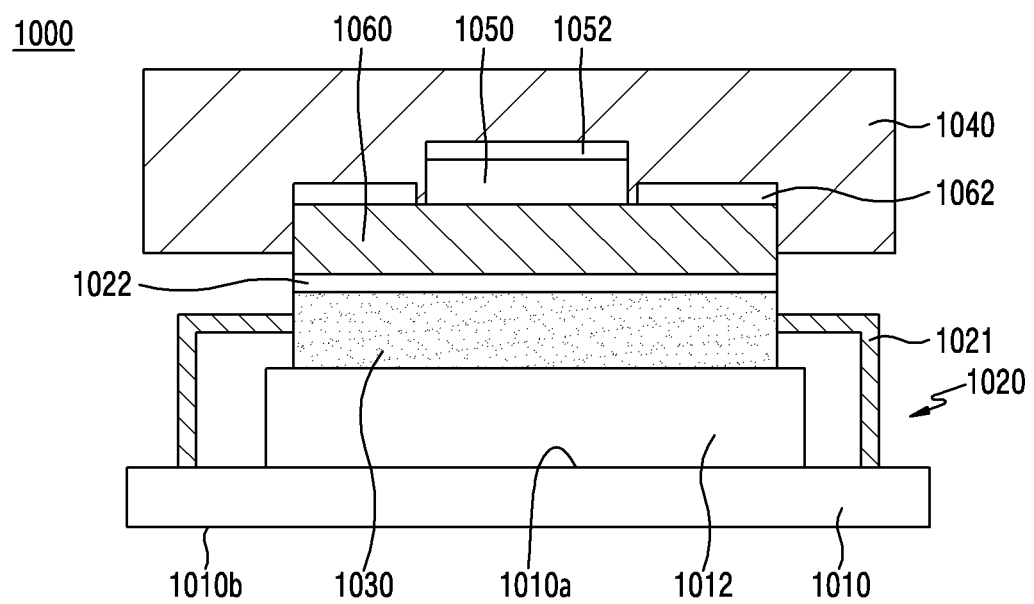

FIG. 10 is cross-sectional view illustrating an electronic device in which a shielding structure and a heat transfer structure according to various embodiments of the present disclosure are applied in a stacked form. Referring to FIG. 10, an electronic device 1000 according to various embodiments may be the same as the electronic device 400 illustrated in FIG. 4. In addition, a heat pipe 1050 according to various embodiments may be the same as the heat pipe 650 illustrated in FIG. 6. A heat collection device 1060 according to various embodiments of the present disclosure may be the same as each of the heat collection devices 760 and 860 illustrated in FIGS. 7 and 8.

The electronic device 1000 according to various embodiments may include a board 1010, a heat generation source 1012, a shielding structure 1020, a TIM 1030, a heat collection device 1060, and a heat pipe 1050.

The electronic device 1000 according to various embodiments may be configured such that heat, generated from the heat generation source 1012, is transferred via the TIM 1030, the transferred heat is collected by the heat collection device 1060, and then the collected heat is transferred by the heat pipe 1050. The heat transfer structure is applied to the shielding structure 1020, so that the heat, generated from the heat generation source 1012, can be transferred to the heat pipe 1050 via the shielding structure 1020 and the heat collection device 1060.

The board 1010 according to various embodiments may include a first face 1010a facing the first direction and a second face 1010b facing the second direction opposite the first face 1010a. The board 1010 may have various electronic components mounted on each of the first and second faces 1010a and 1010b. The heat generation source 1012 may be mounted on the first face 1010a of the board according to various embodiments. For example, the heat generation source 1012 may be of a chip type and may include an AP, a CP, a PA of an RF unit, or the like.

The shielding structure 1020 according to various embodiments may be a device for shielding electromagnetic waves generated from the heat generation source 1012 and may include a shield can for shielding EMI. The shielding structure 1020 may be disposed to enclose the side faces and the top face of the heat generation source 1012. The shielding structure 1020 may include a shield frame 1021 configured to enclose the side faces of the heat generation source 1012 and a shield cover 1022 configured to cover the shield frame 1021. The shield cover 1022 may be a plate including a thin metal material and may be referred to as a shield film or a shield sheet. The shield cover 1022 may include a metal material, and may include a material such as copper that is excellent in thermal conductivity and is capable of preventing static electricity.

The TIM 1030 according to various embodiments may be disposed between the top face of the heat generation source 1012 and the bottom face of the shield cover 1022. The TIM 1030 may include a material, which is a liquid phase or is near the liquid phase, or a material, which is a solid phase or is near the solid phase. The top face of the heat generation source 1012 and the TIM 1030 should be in close contact with each other in order to increase the thermal conductivity, so that the heat conductivity can be increased and the heat generated from the heat generation source 1012 can be transferred to the TIM 1030.

The heat collection device 1060 according to various embodiments may be disposed between the top face of the shield cover 1022 and the bottom face of the heat pipe 1050. The heat collection device 1060 is able to collect heat, transferred from the shield cover 1022, and to transfer the collected heat to the heat pipe 1050. In addition, the heat collection device 1060 may transfer the heat, transferred from the shield cover 1022, to the inner support bracket 1040, thereby performing an additional transfer function. Because the inner support structure 1040 is a low temperature region, the inner support structure 1040 is able to directly transfer the heat, transferred from the heat collection device 1060, to the heat pipe 1050, and to transfer the heat to the inner support bracket 1040. In addition, the heat, transferred to the inner support structure 1040, can be transmitted back to the heat pipe 1050. For example, the inner support structure 1040 may include a bracket.

In the electronic device 900 according to various embodiments, the first TIM 930 may be bonded on the heat generation source 912 in a vertically stacked form, the shield cover 922 may be bonded on the first TIM 930 in a vertically stacked form, the second TIM 932 may be disposed on the shield cover 922 in a vertically stacked form, and the heat pipe 950 and the inner support structure 940 may be disposed on the second TIM 932 in a vertically stacked form. Respective layers can be densely bonded to each other. Reference numeral 1052 denotes a thermally conductive tape which is an adhesive layer of the heat pipe 1050, and reference numeral 1062 denotes a soldering portion or a solder layer for bonding the heat collection device 1060 to the inner support structure 1040.

The heat collection device 1060 according to various embodiments may be configured such that a face thereof that faces the top face of the heat generation source 1012 is the same or slightly smaller than the top face of the heat generation source 1012.

Figure 11:
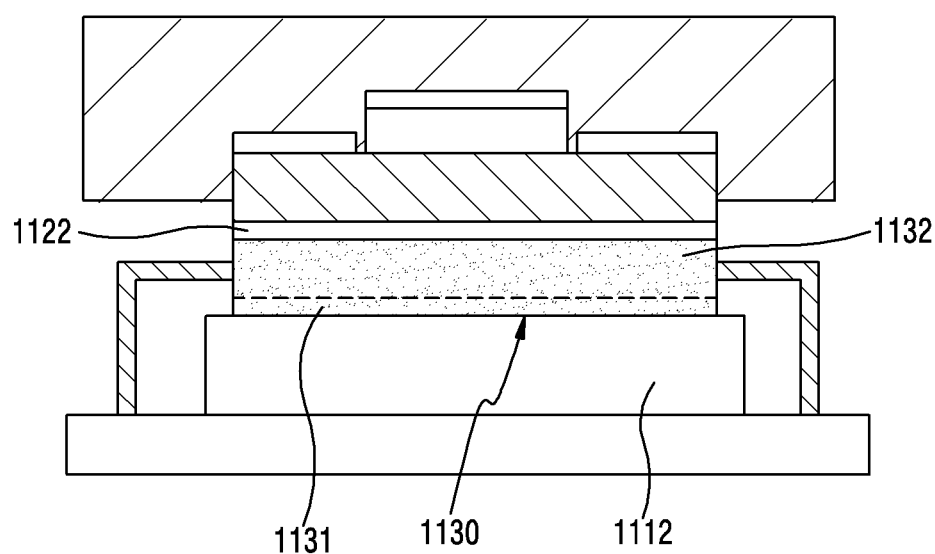

FIG. 11 is cross-sectional view illustrating an electronic device in which a heat transfer structure according to various embodiments of the present disclosure are applied to a shielding structure in a stacked form.

Referring to FIG. 11, an electronic device 1100 according to various embodiments is different from the electronic device 1000 illustrated in FIG. 10 in the configuration of a TIP 1130, but is the same as the electronic device 1000 in the remaining configuration. Thus, descriptions of the remaining configuration will be omitted. The TIM 1130 according to various embodiments may be disposed between the top face of the heat generation source 1112 and the bottom face of the shield cover 1122.

The TIM 1130 according to various embodiments may be composed of a first TIM 1131, which is a liquid phase or is near the liquid phase and a second TIM 1132, which is a solid phase or is near the solid phase. The TIM, which is the liquid phase or is near the liquid, is in close contact with the other components, and is superior to the TIM, which is the solid phase. On the other hand, the TIM, which is the solid phase, is superior in thermal conductivity to the TIM, which is the liquid phase, but is inferior in bonding force.

The electronic device 1100 according to various embodiments may employ a mixed TIM 1130 for transferring heat to be transferred from the heat generation source 1112.

The top face of the heat generation source and the TIM 1030 should be in close contact with each other in order to increase the thermal conductivity, so that the heat conductivity can be increased and the heat generated from the heat generation source 1112 can be transferred to the TIM 1030. Rather than a solid TIM, a liquid TIM may be placed on the top face of the heat generation source. For high thermal conductivity, the layer thickness of the second TIM 1132 may be configured to be greater than the layer thickness of the first TIM 1131.

Figure 12:
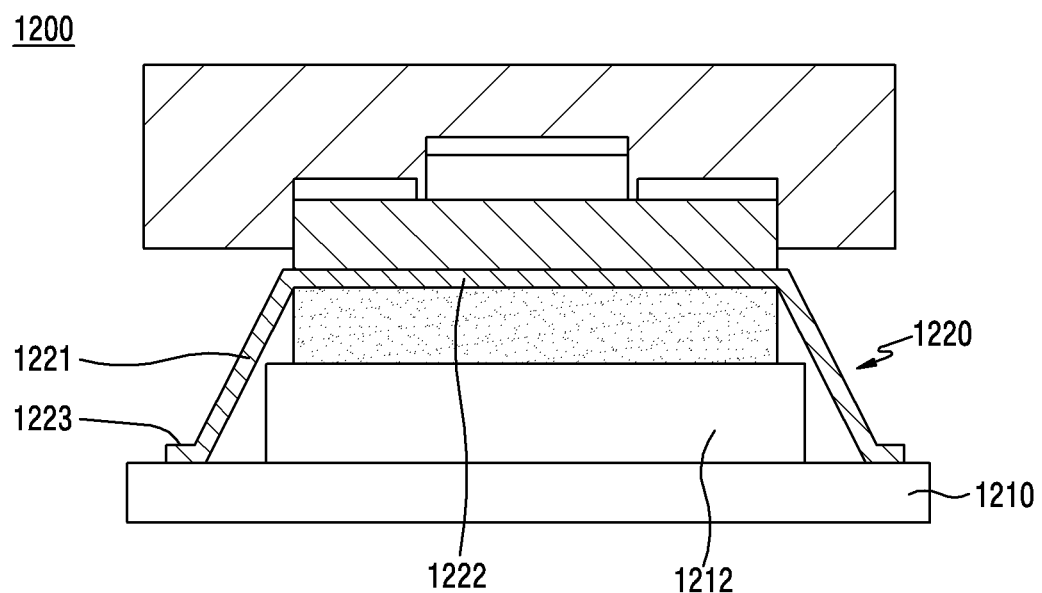

FIG. 12 is cross-sectional view illustrating an electronic device in which a heat transfer structure and a shielding structure according to various embodiments of the present disclosure are applied in a stacked form.

Referring to FIG. 12, an electronic device 1200 according to various embodiments is different from the electronic device 1000 illustrated in FIG. 10 in the configuration of a shielding structure 1220, but is the same as the electronic device 1000 in the remaining configuration. Thus, descriptions of the remaining configuration will be omitted.

The shielding structure 1220 according to various embodiments may have a structure that encloses the side faces and the top face of the heat source 1212 with a shield cover 1222. For example, the shield cover 1222 may be constituted by a shield film so as to close the heat generation source 1212 by the portion thereof located on the top face 1221 of the heat generation source 1212 as well as portions 1221 located at the lateral sides of the heat generation source 1212. The end portions 1223 of the shielding structure 1220 can be fixed using a fastening structure using fasteners not illustrated or welding on the board 1210.

Figure 13:
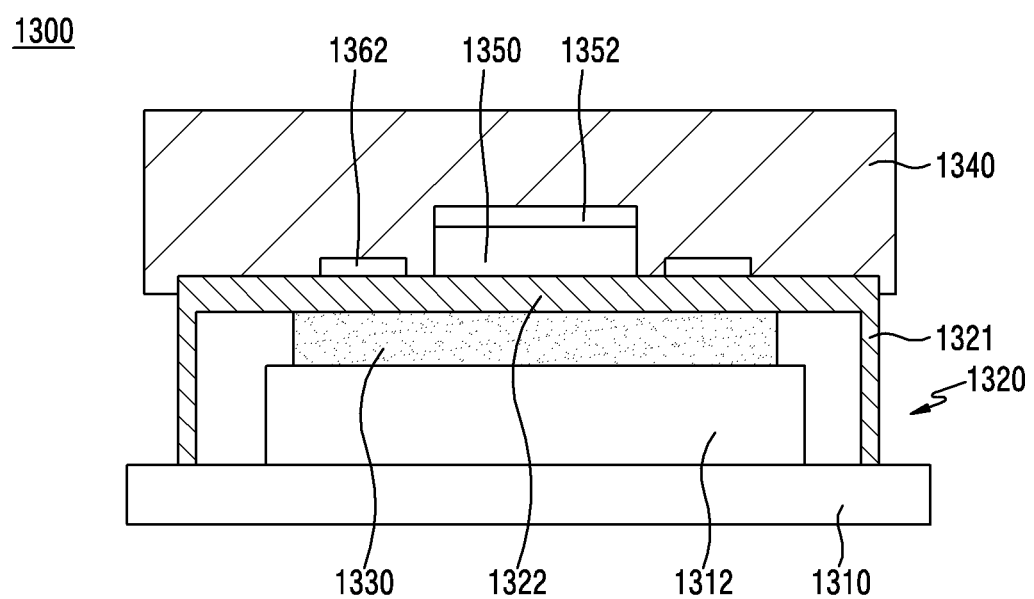

FIG. 13 is cross-sectional view illustrating an electronic device in which a shielding structure and a heat transfer structure according to various embodiments of the present disclosure are applied in a stacked form.

Referring to FIG. 13, an electronic device 1300 according to various embodiments may be the same as the electronic device 400 illustrated in FIG. 4. In addition, a heat pipe 1350 according to various embodiments may be the same as the heat pipe 650 illustrated in FIG. 6.

An electronic device 1300 according to various embodiments may include a board 1310, a heat generation source 1312, a heat collection device/shielding structure 1320, a TIM 1330, and a heat pipe 1350.

The electronic device 1300 according to various embodiments may be configured such that heat, generated from the heat generation source 1312, is transferred via the TIM 1330, the transferred heat is collected by the heat collection device/shielding structure 1330, and then the collected heat is transferred by the heat pipe 1350.

The heat collection device/shielding structure 1320 according to various embodiments may include a metal material, and may serve to shield the EMI generated from the board 1310 and to collect heat generated from the heat generation source. For example, the heat collection device/shielding structure 1320 may provide a structure for performing the functions of the heat collection device and the shielding structure illustrated in FIG. 10.

The electronic device 1300 according to various embodiments may be configured such that heat, generated from the heat generation source 1312, can be transferred and collected by the heat collection device/shielding structure 1320, and can be directly transferred to the heat pipe 1350. The heat collection device/shielding structure 1320 according to various embodiments may include a shield frame 1321 and a heat collection device/shield cover 1322.

The heat collection device/shielding structure 1320 according to various embodiments may be disposed to enclose the side faces and the top face of the heat generation source 1312. The shield cover 1322 is a thin metal plate, and may include a shield film or a shield sheet. The shield cover 1322 includes a metal material and is excellent in thermal conductivity.

The TIM 1330 according to various embodiments may be disposed between the top face of the heat generation source 1312 and the bottom face of the heat collection device/shield cover 1322. The TIM 1330 may be composed of a material, which is a liquid phase or is near the liquid phase, or a material, which is a solid phase or is near the solid phase. The top face of the heat generation source 1312 and the TIM 1330 should be in close contact with each other in order to increase the thermal conductivity, so that the heat conductivity can be increased and the heat generated from the heat generation source 1012 can be transferred to the TIM 1030.

The heat collection device/shield cover 1322 according to various embodiments may serve to collect the heat transferred from the heat transfer material 1330 and to transfer the collected heat to the heat pipe 1350. The heat collection device/shield cover 1322 is able to transfer the transferred heat to the inner support bracket 1340. Because the inner support structure 1340 is a low temperature region, the inner support structure 1340 is able to transfer the heat, transferred from the heat collection device/shield cover 1322, to the heat pipe 1350, and to transfer the heat to the inner support bracket 1340. In addition, the heat, transferred to the inner support structure 1340, can be transmitted back to the heat pipe 1350.

In the electronic device 1300 according to various embodiments, the TIM 1330 may be bonded on the heat generation source 1312 in a vertically stacked form, the heat collection device/shield cover 1322 may be bonded on the TIM 1330 in a vertically stacked form, the heat pipe 1350 and the inner support structure 1340 may be disposed on the heat collection device/shield cover 1322 in a vertically stacked form. Respective layers can be densely bonded to each other. Reference numeral 1352 denotes a thermally conductive tape which is an adhesive layer of the heat pipe 1350, and reference numeral 1362 denotes a soldering portion or a solder layer for bonding the heat collection device/shield cover 1322 to the inner support structure 1340.

Figure 14:
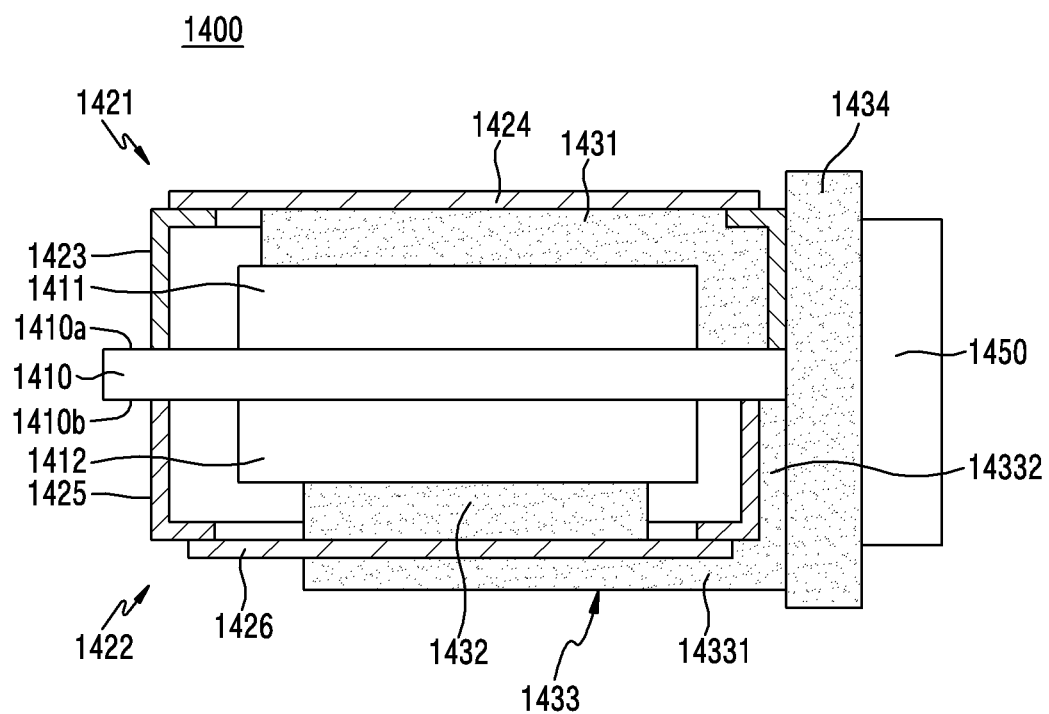

FIG. 14 is cross-sectional view illustrating an electronic device in which a heat transfer structure is applied to a shielding structure according to various embodiments of the present disclosure in a stacked form.

Referring to FIG. 14, the electronic device 1400 according to various embodiments may be the same as the electronic device illustrated in FIGS. 1A to 1C. An electronic device 1400 according to various embodiments may include a board 1410, first and second heat generation sources 1411 and 1412, first and second shielding structures 1421 and 1422, first to fourth TIMs 1431 to 1434, and a heat pipe 1450. Each of the first and second shielding structures 1421 and 1422 according to various embodiments of the present disclosure may be the same as the shielding device 1020 illustrated in FIG. 10. In addition, a heat pipe 1450 according to various embodiments may be the same as the heat pipe 650 illustrated in FIG. 6.

The electronic device 1400 according to various embodiments may be configured such that heat, generated from the first heat generation source 1411, is transferred to the first shielding structure 1421 via the first TIM 1431, and is transferred to the heat pipe 1450 by the fourth TIM 1434. The electronic device 1400 according to various embodiments may be configured such that heat, generated from the second heat generation source 1412, is transferred to the second shield cover 1426 by the second TIM 1432, and the heat, transferred to the second shield cover 1426, is transferred to the fourth TIM 1434 via the third TIM 1433 and is transferred to the heat pipe 1450 by the fourth TIM 1434.

The board 1410 according to various embodiments may include a first face 1410a facing the first direction and a second face 1410b facing the second direction opposite the first face 1410a. The board 1410 may have various electronic components mounted on each of first and second faces 1410a and 1410b. The first heat generation source 1411 may be disposed on the first face 1410a of the board and the second heat generation source 1412 may be disposed on the second face 1410b of the board. For example, each of the first and second heat generation sources 1411 and 1412 may be of a chip type and may include an AP, a CP, a PA of an RF unit, or the like.

The first and second shielding structures 1421 and 1422 according to various embodiments may be devices for shielding electromagnetic waves generated from the first and second heat generation sources 1411 and 1412, respectively, and may each include a shield can for shielding EMI. The first and second shielding structures 1421 and 1422 may be disposed to enclose the side faces and the top face of the first and second heat generation sources 1411 and 1412, respectively.

The first shielding structure 1421 according to various embodiments may include a first shield frame 1423 configured to enclose the side faces of the first heat generation source 1411 and a first shield cover 1424 configured to cover the first shield frame 1423.

The first shield cover 1424 may be coupled to close the top face of the first shield frame 1423. The first shield cover 1424 is a thin metal plate, and may include a shield film or a shield sheet. The first shield cover 1424 may include a metal material, and may include a material such as copper that is excellent in thermal conductivity and is capable of preventing static electricity.

The second shielding structure 1422 according to various embodiments may include a second shield frame 1425 configured to enclose the side faces of the second heat generation source 1412 and a second shield cover 1426 configured to cover the second shield frame 1425. The second shield cover 1426 may be coupled to close the top face of the second shield frame 1425. The second shield cover 1426 is a thin metal plate, and may include a shield film or a shield sheet. The second shield cover 1426 may include a metal material, and may include a material such as copper that is excellent in thermal conductivity and is capable of preventing static electricity.

The first to fourth TIMs 1431 to 1434 according to various embodiments may include a TIM 930, which is a liquid phase or is near the liquid phase, a TIM 932, which is a solid phase or is near the solid phase, or a combination thereof.

The first TIM 1431 according to various embodiments may be disposed between the top face and a side face of the first heat generation source 1411 and the bottom face of the first shield cover 1424 and the first shield frame 1423. The first TIM 1431 may be filled in the space enclosed by the first heat generation source 1411, the first shield cover 1424, and the first shield frame 1423. The heat, generated from the first heat source 1411, is transferred to the first shield cover 1424 and the first shield frame 1423, and the heat, transferred to the first shield frame 1423, is transferred to the fourth TIM 1434 and is finally transferred to the heat pipe 1450. Although not illustrated in the drawings, the first shield cover 1424 may be configured such that heat may be transferred to the internal support structure. Alternatively, although not illustrated, the heat pipe 1450 may further include a heat collection device.

The second TIM 1432 according to various embodiments may be disposed between the top face of the second heat generation source 1412 and the second shield cover 1426. The heat, generated from the second heat generation source 1412, may be transferred to the second shield cover 1426 by the second TIM 1432.

The third TIM 1433 according to various embodiments may be filled in the space between the bottom face of the second shield cover 1426 and the second shield framer 1425. The third TIM 1433 filled in the space may be divided into two portions. A first portion 14331 may be a portion attached to the second shield cover 1426 and a second portion 14332 may be a portion disposed between the second shield frame 1425 and the fourth TIM 1434. The heat, transferred from the second shield cover 1426, is transferred to the second portion 14332 via the first portion 14331, and the heat, transferred to the second portion 14332, is transferred to the fourth TIM 1434 and is finally transferred to the heat pipe 1450.

The fourth TIM 1434 and the heat pipe 1450 according to various embodiments may be heat transfer paths for transferring heat to the lateral sides of the first heat generation source 1411, the second heat generation source 1412, or the first and second heat sources 1411 and 1412. The fourth TIM 1434 may laterally extend with respect to the first and second heat generation sources 1411 and 1412, so that the fourth TIM 1434 is able to transfer the heat, transferred thereto, to the heat pipe 1450 disposed to laterally face the fourth TIM 1434.

The electronic device 140 according to various embodiments may be configured such that a first heat transfer structure disposed in the first shielding structure 1421 of the first face 1401a of the board is disposed to be symmetrical to the second shielding structure 1422 of the second face of the board, and a second heat transfer structure disposed in the second shielding structure 1422 of the second face 1410b of the board may be disposed to be symmetrical to the first shielding structure 1421 of the first face 1410a of the board.

Figure 15:
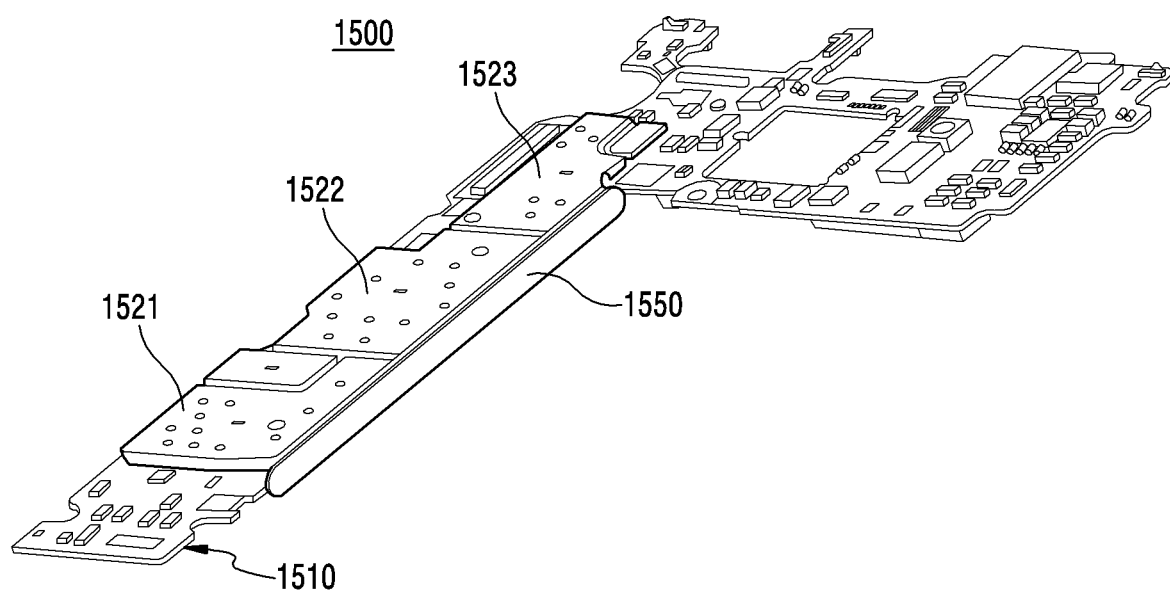
FIG. 15 is a perspective view illustrating a board to which a heat pipe is applied in a lateral direction of a shielding structure according to various embodiments of the present disclosure.

FIG. 15 is a perspective view illustrating a board to which a heat pipe is applied in a lateral direction of a shielding structure according to various embodiments of the present disclosure.

Referring to FIG. 15, an electronic device 1500 according to various embodiments may be the same as the electronic device 100 illustrated in FIGS. 1A to 1C. The electronic device 1500 according to various embodiments may include a board 1510, a plurality of shielding structures 1521 to 1523 mounted on a first face of the board 1510, and a heat pipe 1550 disposed on a side face of each of the shielding structures 1521 to 1523 so as to be connected to each of the shielding structures 1521 to 1523. The plurality of shielding structures 1521 to 1523 may be mounted on the first face of the board 1510 according to various embodiments, and each of the shielding structures 1521 to 1523 may be disposed to be spaced apart from each other. The shielding structures 1521 to 1523 may be disposed to be in contact with each other. The heat, generated from respective shield structures 1521 to 1523, can be transmitted to one heat pipe 1550. The heat pipe 1550 may be bonded to respective shielding structures 1521 to 1523 through a soldering process. The temperature of each of the shielding structures 1521 to 1523 can be lowered downward by the heat pipe 1550.

Figure 16A:
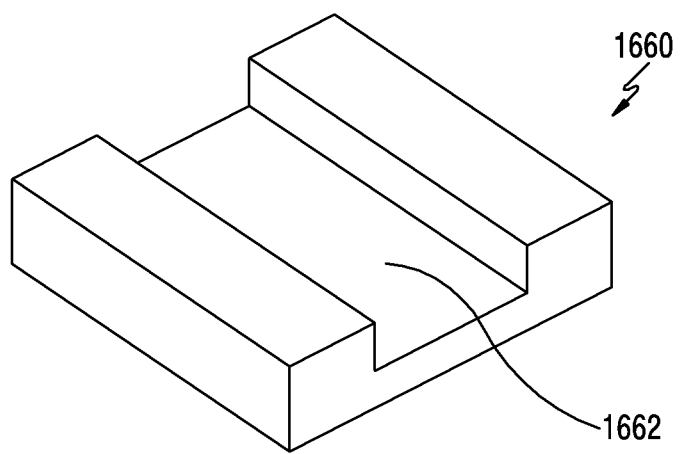
FIG. 16A is a perspective view illustrating a heat collection device according to various embodiments of the present disclosure.
Figure 16B:
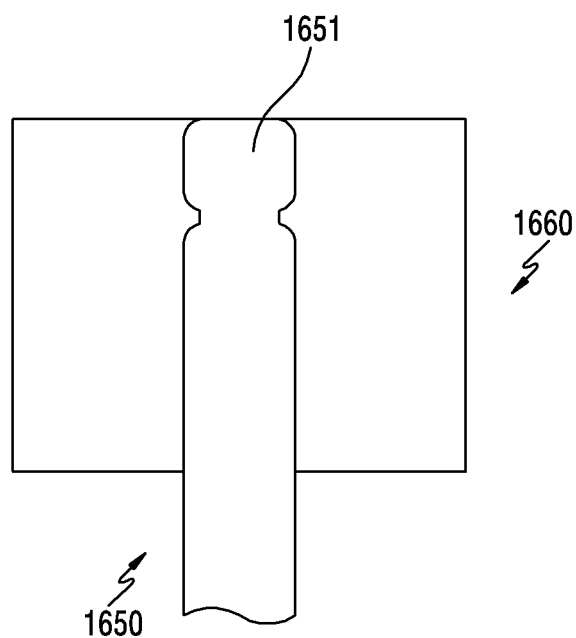
FIG. 16B is a plan view illustrating a state in which a portion of the heat pipe is coupled to the heat collection device according to various embodiments of the present disclosure.

FIG. 16A is a perspective view illustrating a heat collection device according to various embodiments of the present disclosure. FIG. 16B is a plan view illustrating a state in which a portion of the heat pipe is coupled to the heat collection device according to various embodiments of the present disclosure.

Referring to FIGS. 16A and 16B, a heat collection device 1660 according to various embodiments may be the same as the heat collection devices 860 illustrated in FIG. 8 and the heat collection device 1060 illustrated in FIG. 10. The heat collection device 1660 according to various embodiments may be configured to have a surface that faces the top face of the heat generation source, particularly a surface having a size similar to that of the top face of the heat generation source, and may have a plate shape including a metal having a high thermal conductivity similar to that of copper.

The heat collection device 1660 according to various embodiments may include a first end 1651 of a heat pipe 1650 and a recess 1662 to which the first end 1651 is coupled. The recess 1662 is formed in a shape depressed with a predetermined depth from the top face of the heat collection device 1660, and a portion of the heat pipe may be inserted into the recess and may be bonded through a soldering process or using a double-sided tape (not illustrated) having a high thermal conductivity.

Various bonding structures between the heat pipe and the heat collection device according to various embodiments will be described with reference to FIGS. 17A to 17D.

Figure 17A:
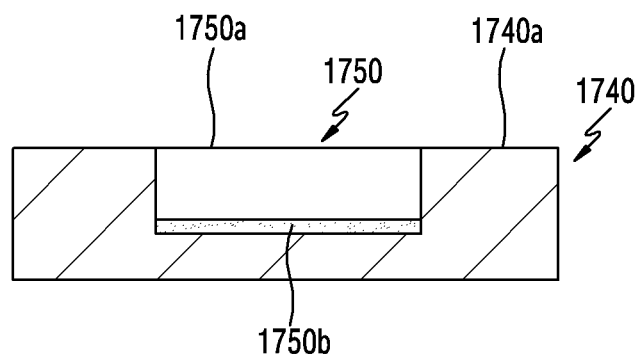
FIGS. 17A to 17D are cross-sectional views each illustrating a state in which a portion of a heat pipe is coupled to a support structure in accordance with various embodiments of the present disclosure.

FIG. 17A is a cross-sectional view illustrating a state in which a portion of a heat pipe 1750 is bonded to an inner support structure 1740 according to various embodiments of the present disclosure.

Referring to FIG. 17A, the heat pipe 1750 according to various embodiments may be bonded to the recess formed in the inner support structure 1740 using a double-sided tape 1750b having a high thermal conductivity. Instead of the double-sided tape 1750b having a high thermal conductivity to be used as a bonding material, the heat pipe 1750 and the inner support structure 1740 may be bonded to each other through a soldering process. When the heat pipe 1740 is coupled to the recess of the inner support structure 1750, the top face 1750a of the heat pipe may be approximately coplanar with the top face 1740a of the inner support structure. Respective mating faces on the heat pipe 1750 according to various embodiments may be in intimate contact with respective mating faces formed in the recess. For example, when a space exists between the respective mating faces on the heat pipe 1750 and the respective mating faces formed in the recess, the heat transfer efficiency may be reduced. Thus, an empty space can be filled with a heat transfer material such as solder.

Figure 17B:
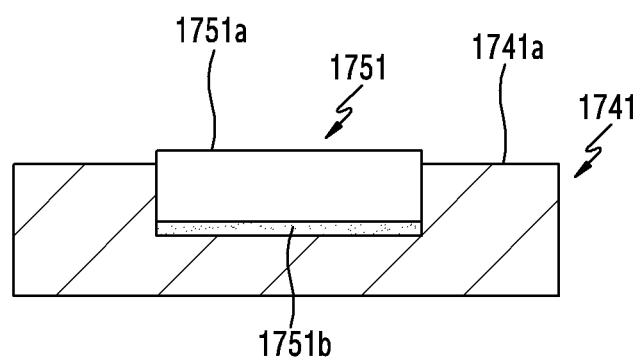

FIG. 17B is a cross-sectional view illustrating a state in which a portion of the heat pipe 1751 is bonded to the inner support structure 1741 according to various embodiments of the present disclosure.

Referring to FIG. 17B, the heat pipe 1751 according to various embodiments may be bonded to the recess formed in the inner support structure 1741 using a double-sided tape 1751b having a high thermal conductivity. Instead of the double-sided tape 1751b having a high thermal conductivity to be used as a bonding material, the heat pipe 1751 and the inner support structure 1741 may be bonded to each other through a soldering process. When the heat pipe 1751 is coupled to the recess of the inner support structure 1741, the top face 1751a of the heat pipe may be disposed to slightly protrude from the top face 1741a of the inner support structure.

Figure 17C:
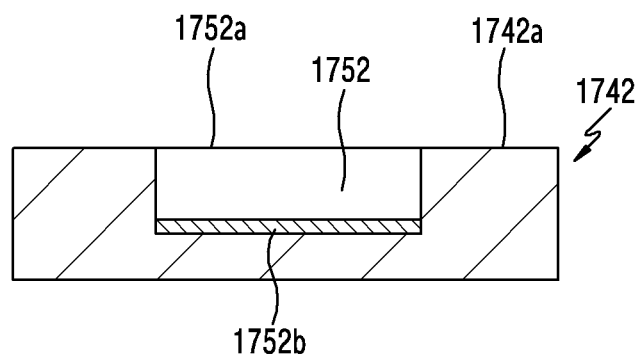

FIG. 17C is a cross-sectional view illustrating a state in which a portion of the heat pipe 1752 is bonded to the inner support structure 1742 according to various embodiments of the present disclosure.

Referring to FIG. 17C, the heat pipe 1752 according to various embodiments may be bonded to the recess formed in the inner support structure 1742 using a PCM sheet 1752b. When the heat pipe 1752 is coupled to the recess of the inner support structure 1742, the top face 1752a of the heat pipe may be approximately coplanar with the top face 1742a of the inner support structure. Respective mating faces on the heat pipe 1752 according to various embodiments may be in intimate contact with respective mating faces formed in the recess. For example, when a space exists between the respective mating faces on the heat pipe 1752 and the respective mating faces formed in the recess, the heat transfer efficiency may be reduced. Thus, an empty space can be filled with a heat transfer material such as solder.

FIG. 17C is a cross-sectional view illustrating a state in which a portion of the heat pipe 1753 is bonded to the inner support structure 1743 according to various embodiments of the present disclosure.

Figure 17D:
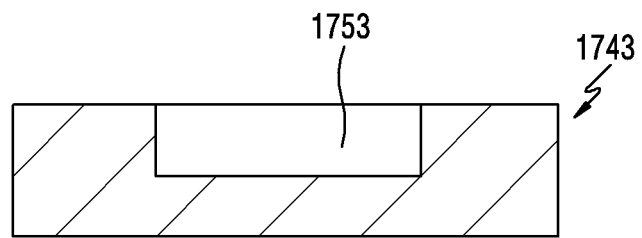

Referring to FIG. 17D, the heat pipe 1753 according to various embodiments may be fabricated integrally with the inner support structure 1743. When the inner support structure 1743 is manufactured through a die casting process or an injection process, the heat pipe 1753 may be integrally formed in the inner support structure 1743 through the methods described above.

Figure 18A:
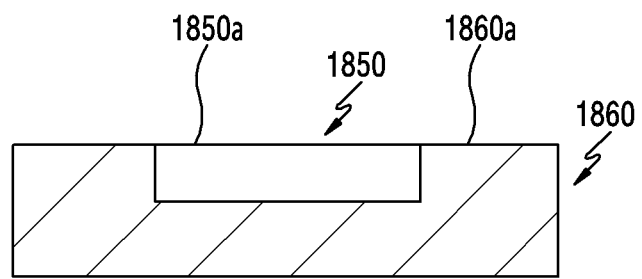
FIGS. 18A and 18B are cross-sectional views each illustrating a state in which a portion of a heat pipe is coupled to a heat collection device according to various embodiments of the present disclosure.

FIG. 18A is a cross-sectional view illustrating a state in which a portion of a heat pipe 1850 is bonded to a heat collection device 1860 according to various embodiments of the present disclosure.

Referring to FIG. 18A, the heat pipe 1850 according to various embodiments may be bonded to a recess formed in the heat collection device 1860 through a soldering process. When the heat pipe 1850 is bonded to the recess of the heat collection device 1860, the top face 1850a of the heat pipe 1850 may be approximately coplanar with the top face 1860a of the heat collection device. Respective mating faces on the heat pipe 1850 according to various embodiments may be in intimate contact with respective mating faces formed in the recess.

Figure 18B:
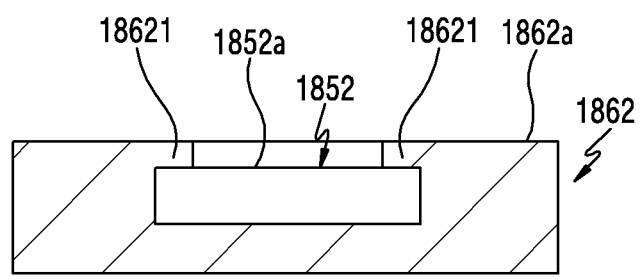

FIG. 18B is a cross-sectional view illustrating a state in which a portion of the heat pipe 1852 is bonded to the heat collection device 1862 according to various embodiments of the present disclosure.

Referring to FIG. 18B, the heat collection device 1862 according to various embodiments has a recess formed therein, and an engagement structure 18621 is formed in the recess, so that the heat collection device 1862 can be tightly coupled without using a material, which is excellent in adhesive force and thermal conductivity. When the heat pipe 1852 is coupled to the recess of the heat collection device 1862, the top face 1852a of the heat pipe may be disposed to be slightly depressed from the top face 1862a of the heat collection device.

Figure 19A:
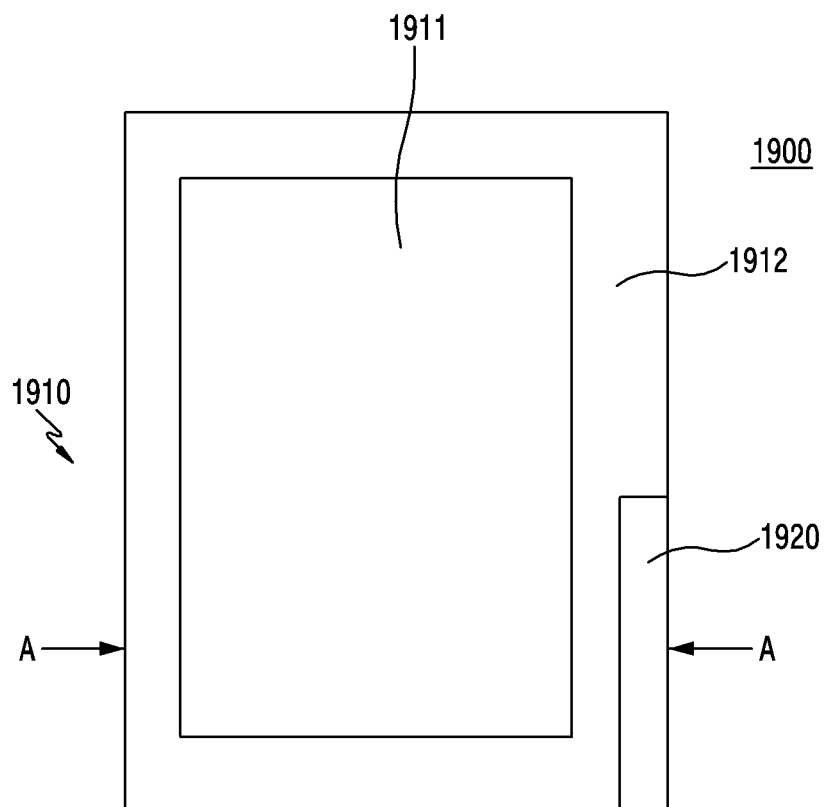
FIG. 19A is a plan view illustrating a state in which a heat pipe is coupled to a display reinforcement plate according to various embodiments of the present disclosure.
Figure 19B:
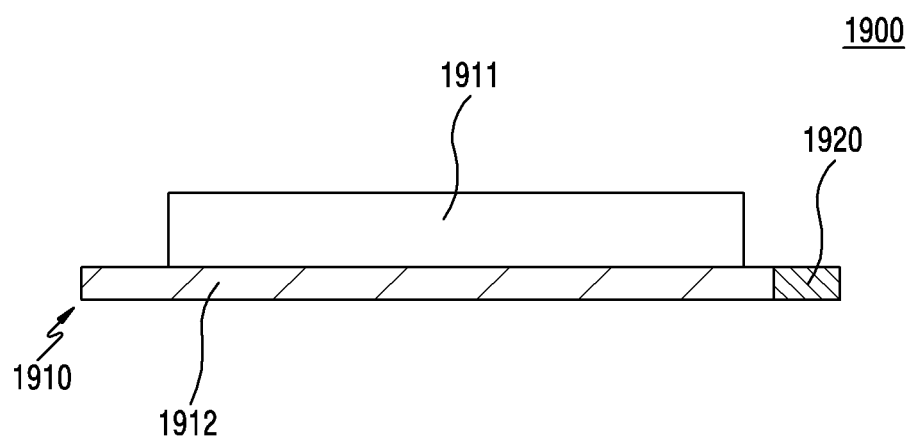
FIG. 19B is a cross-sectional view taken along line A-A in FIG. 19A.

FIG. 19A is a plan view illustrating a state in which a heat pipe is coupled to a display reinforcement plate according to various embodiments of the present disclosure. FIG. 19B is a cross-sectional view taken along line A-A in FIG. 19A.

Referring to FIGS. 19A and 19B, an electronic device 1900 according to various embodiments may be the same as the electronic device 100 illustrated in FIGS. 1A to 1C. The electronic device 1900 according to various embodiments may include a display 1910 disposed on a first face of a housing to be exposed and a heat pipe 1920. The display 1910 may include a display module 1910 and a reinforcement plate 1921 that supports the display module 1910. For example, the reinforcement plate 1912 may be made of a metal material so as to resist the distortion of the display module 1910 or the like. The heat pipe 1920 may be integrally coupled to the reinforcement plate 1912. The heat, transferred from the heat source, can be transferred to the reinforcement plate 1912 through the heat pipe 1920.

Figure 20A:
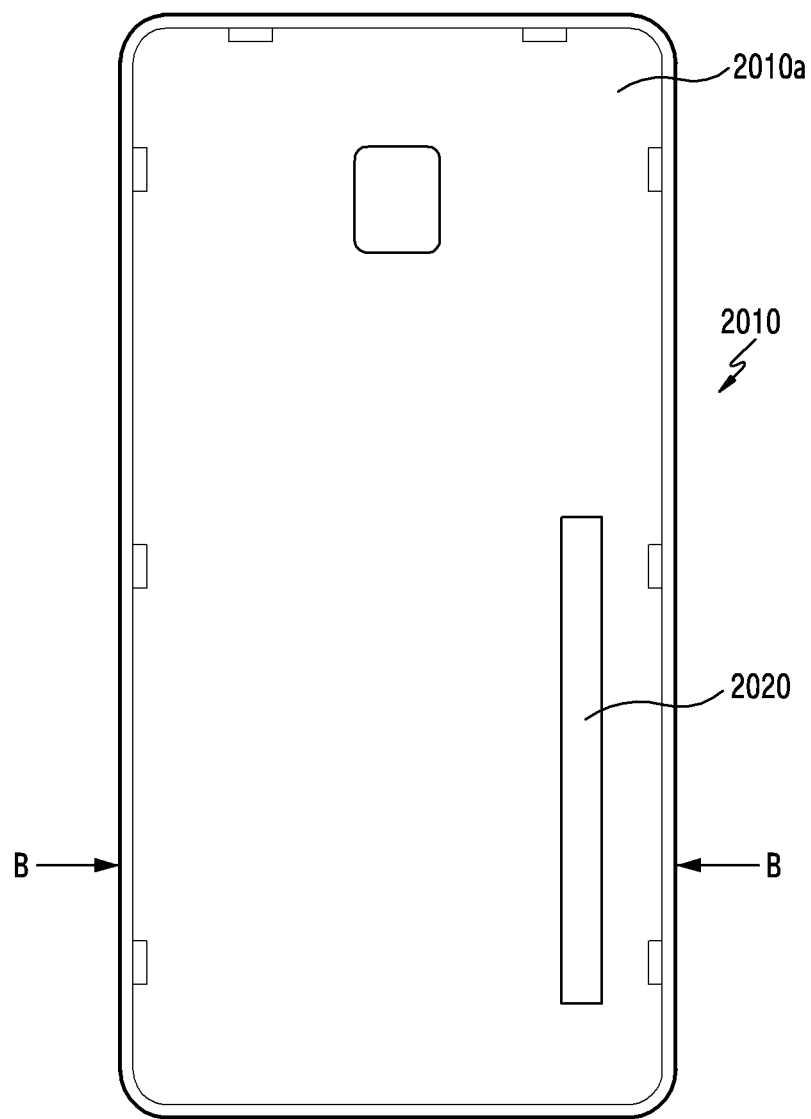
FIG. 20A is a plan view illustrating a state in which a heat pipe is coupled to a rear cover according to various embodiments of the disclosure.
Figure 20B:
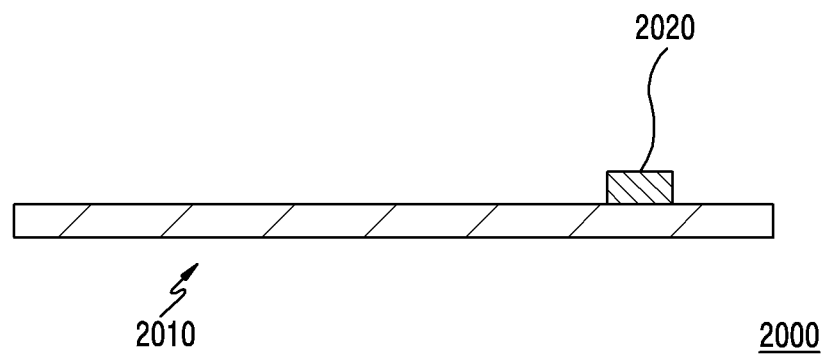
FIG. 20B is a cross-sectional view taken along line B-B in FIG. 20A.

FIG. 20A is a plan view illustrating a state in which a heat pipe is coupled to a rear cover according to various embodiments of the disclosure. FIG. 20B is a cross-sectional view taken along line B-B in FIG. 20A.

Referring to FIGS. 20A and 20B, an electronic device 2000 according to various embodiments may be the same as the electronic device 100 illustrated in FIGS. 1A to 1C. The electronic device 2000 according to various embodiments may include a rear cover 2010 and a heat pipe 2020. The rear cover 2010 may be referred to as a battery cover or an accessory cover. The rear cover 2010 may be configured on the rear case of the electronic device in an integrated type or a removably mounting type. The rear cover 2010 may be constituted with a plastic injection-molded product material and may be detachably mounted on the rear case. Further, the rear cover 2010 may be constituted with an outer metal case and may be integrated with the electronic device.

The heat pipe 2020 according to various embodiments may be coupled to the rear cover 2010 or may be manufactured integrally with the rear cover 2010. When the rear cover 2010 is a plastic injection-molded product, the metal heat pipe 2020 may be manufactured through a double-injection molding method. When the rear cover 2010 is made of a metal material, the heat pipe 2020 may be integrally formed during the manufacturing of the rear cover. The heat pipe 2020 may be formed on the inner face 2010a of the rear cover, which is close to or faces the heat generation source of the electronic device.

Figure 21:
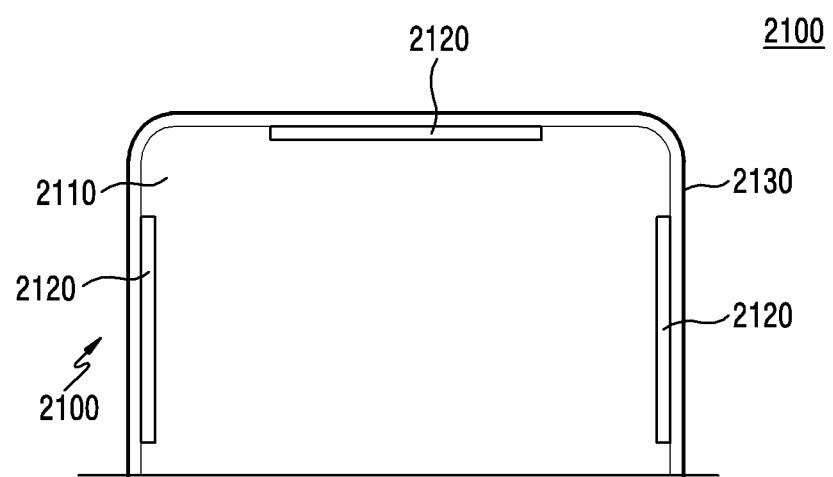
FIG. 21 is a plan view illustrating a state in which a heat pipe is coupled to a rear case according to various embodiments of the disclosure.

FIG. 21 is a plan view illustrating a state in which a heat pipe is coupled to a rear case according to various embodiments of the disclosure.

Referring to FIG. 21, an electronic device 2100 according to various embodiments may have at least one heat pipe 2120 formed in a rim portion (peripheral edge) of a rear case 2110. A recess is formed in the rear case 2110, and a heat pipe 2120 may be coupled to the formed recess. Since the rear case 2110 is made of a plastic material and the heat pipe 2120 is made of a metal material, the heat pipe 2120 may be manufactured in the rear case 2110 through an insert injection molding method. Furthermore, the heat pipe 2120 coupled to the rear case 2110 is able to perform a heat transfer function as well as to serve as a skeleton (frame) of the rear case 2110. The heat transferred to the heat pipe 2120 can be transmitted to the rim portion 2130 of the housing.

The rim portion 2130 according to various embodiments may be constituted with a metal frame, and may serve as an antenna radiator. In addition, the heat pipe 2120 is coupled to the rim portion 2130, so that a heat transfer function can be performed.

Figure 22A:
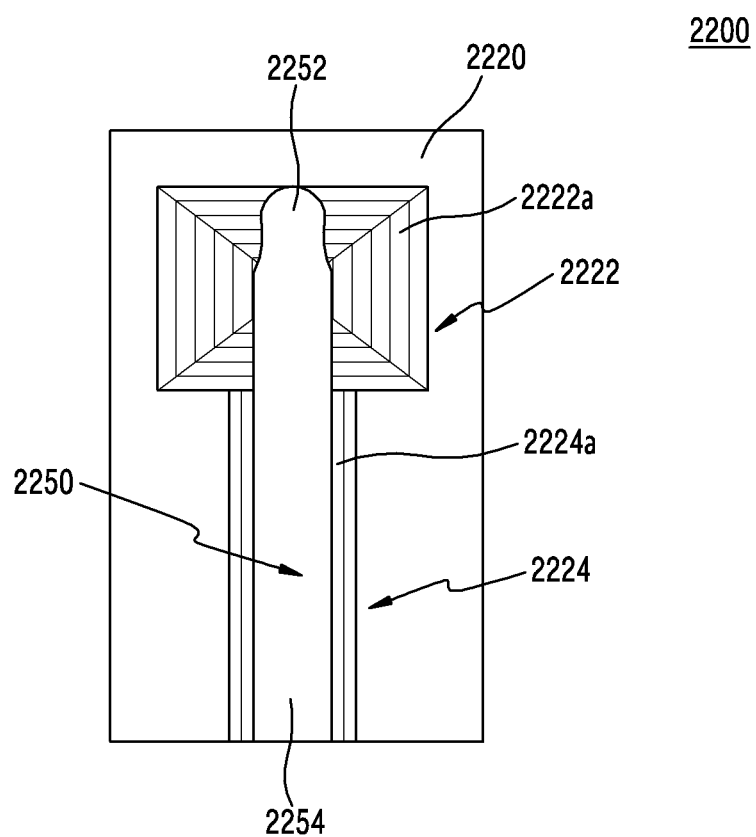
FIG. 22A is a view illustrating a state in which a heat pipe is disposed in first and second accommodation recesses according to various embodiments of the disclosure.
Figure 22B:
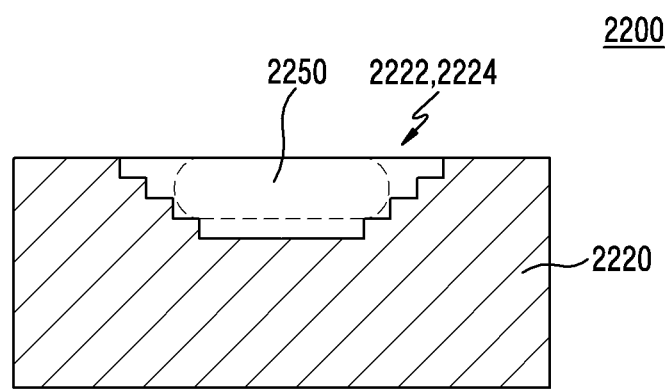
FIG. 22B is a cross-sectional view illustrating the state in which the heat pipe is disposed in the first and second accommodation recesses according to various embodiments of the disclosure.

FIG. 22A is a view illustrating a state in which a heat pipe is disposed in first and second accommodation recesses according to various embodiments of the disclosure. FIG. 22B is a cross-sectional view illustrating the state in which the heat pipe is disposed in the first and second accommodation recesses according to various embodiments of the disclosure.

Referring to FIGS. 22A and 22B, an electronic device 2200 according to various embodiments may include first and second accommodation recesses 2222 and 2224 so as to bond a heat pipe 2250 to a support structure 2220. A first portion 2252 of the heat pipe 2250 may be disposed in the first accommodation recess 2222 and the second portion 2254 of the heat pipe 2250 may be disposed in the second accommodation recess 2224. The heat pipe 2250 may be disposed in the first and second accommodation recesses 2222 and 2224 and the disposed heat pipe 2250 may be fixedly bonded to the first and second accommodation recesses 2222 and 2224 through soldering. Each of the first and second accommodation recesses 2222 and 2224 may be formed through a cutting-off operation of the support structure 2220.

The first accommodation recess 2222 according to various embodiments may enclose the first portion 2252 of the heat pipe, and the bottom of the first accommodation recess 222 may be configured in a stepped shape. For example, a plurality of first steps 2222a may be formed on the bottom of the first accommodation recess 2222. The contact faces between the heat pipe 2250 and the support structure 2220 can be increased by the first steps 2222a. The thermal conductivity to the support structure can be improved by the stepped first accommodation recess 2222.

The second accommodation recess 2224 according to various embodiments may enclose the second portion 2254 of the heat pipe, and the bottom of the second accommodation recess 222 may be configured in a stepped shape. For example, a plurality of second steps 2224a may be formed on the bottom of the second accommodation recess 2224. The contact faces between the heat pipe 2250 and the support structure 2220 can be increased by the second steps 2224a. The thermal conductivity to the support structure can be improved by the stepped second accommodation recess 2224.

Figure 23A:
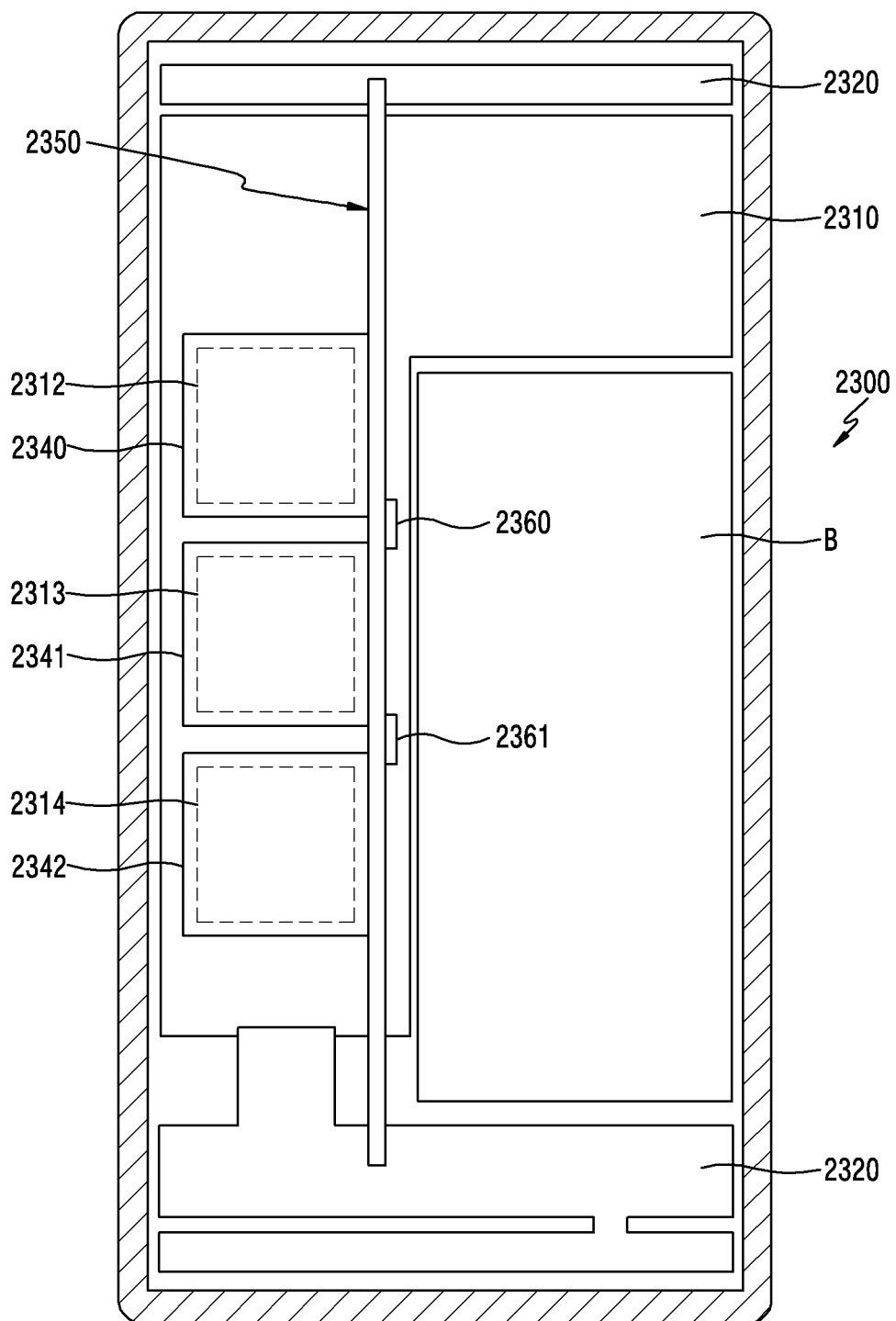
FIG. 23A is a view that a plurality of shielding structures according to various embodiments of the present disclosure is provided with a heat collection/diffusion structure using a clip and a heat pipe.
Figure 23B:
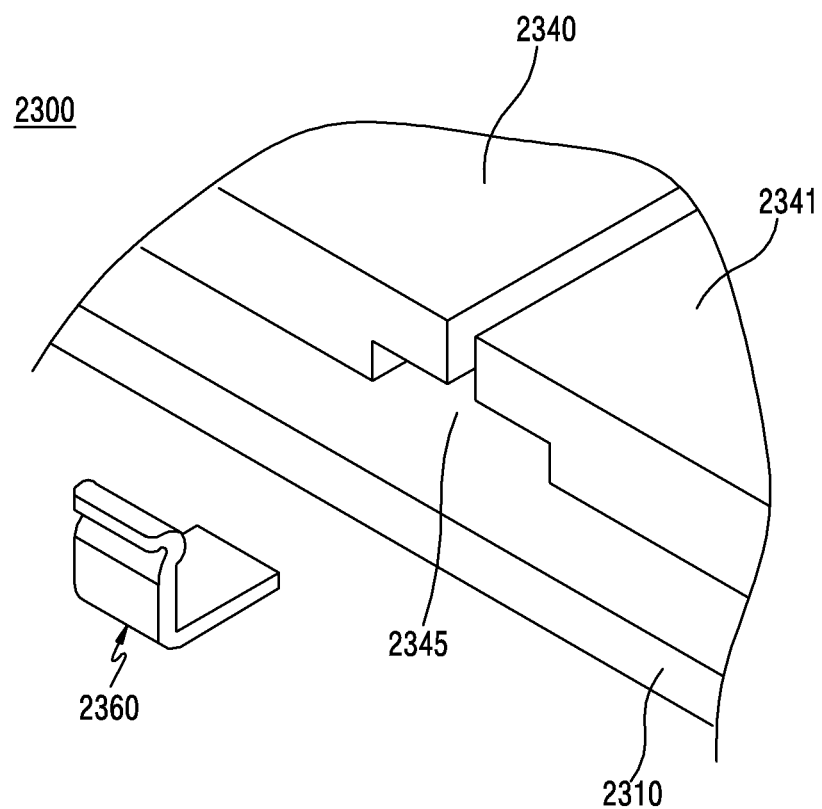
FIG. 23B is a perspective view illustrating a state in which the clip is coupled between first and second shielding structures according to various embodiments of the present disclosure.

FIG. 23A is a view illustrating a state in which a plurality of shielding structures according to various embodiments of the present disclosure is provided with a heat dissipation structure using a clip and a heat pipe. FIG. 23B is a perspective view illustrating a state in which the clip is coupled between first and second shielding structures according to various embodiments of the present disclosure.

Referring to FIGS. 23A and 23B, an electronic device 2300 according to various embodiments includes a heat transfer path, which may be formed in a plurality of shielding structures 2340 to 2342 using one heat pipe 2350 and at least one clip 2360.

The substrate 2310 according to various embodiments may include, on a first face thereof, first to third heat generation elements 2312, 2313, and 2314 and first to third shielding structures 2340, 2341, and 2342, which are mounted on the first to third heat generation elements 2312, 2313, and 2314, respectively. The first heat generation element 2312 is enclosed by the first shielding structure 2340, the second heat generation element 2313 is enclosed by the second shielding structure 2341, and the third heat generation element 2314 is enclosed by the third shielding structure 2342. The respective first to third shielding structures 2340 to 2342 may be disposed on the board 2310 to be spaced apart from each other.

The first and second shielding structures 2340 and 2341 according to various embodiments may be physically and electrically connected to each other using the first clip 2360, and the second and third shielding structures 2341 and 2342 may be physically and electrically connected to each other using the second clip 2361. The first clip 2360 is inserted into a coupling opening 2345 formed by the first and second shielding structures 2340 and 2341, so that the heat pipe 2350 can be placed in close contact with the side faces of the first and second shielding structures 2340 and 2341. The second clip 2361 is inserted into a coupling opening (not illustrated) formed by the second and third shielding structures 2341 and 2342, so that the heat pipe 2350 can be placed in close contact with the side faces of the second and third shielding structures 2341 and 2342.

The heat pipe 2350 according to various embodiments may be disposed between the side faces of the first, second, and third shielding structures 2340 to 2342 and the first and second clips 2360 and 2361, so that heat, generated from each of the first, second, and third heat generation elements 2312, 2313, and 2314, can be transferred to the support structure 2320. The coupling position of each of the first and second clips 2360 and 2361 may be, but not exclusively, located between the first and second shielding structures 2340 and 2341. Reference character B denotes a battery pack.

Figure 24:
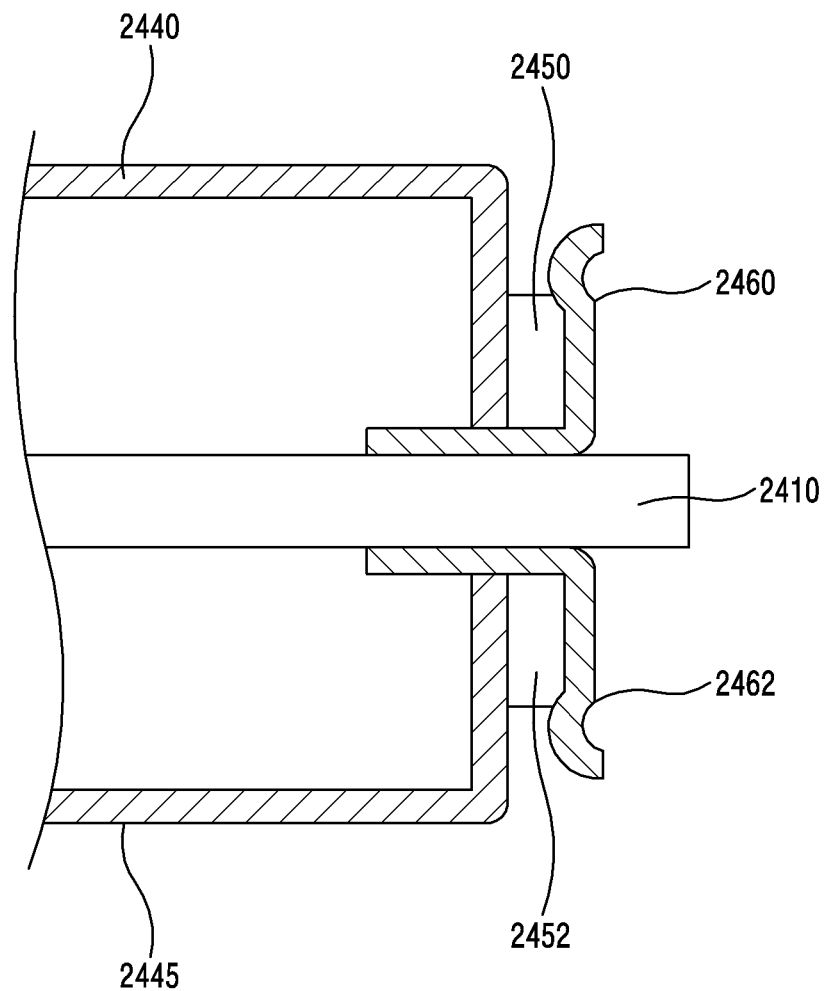
FIG. 24 is a cross-sectional view illustrating a state in which each of first and second faces of a board according to various embodiments of the present disclosure is provided with a heat collection/diffusion structure.

FIG. 24 is a cross-sectional view illustrating a state in which each of first and second faces of a board according to various embodiments of the present disclosure is provided with a heat dissipation structure.

Referring to FIG. 24, an electronic device 2400 according to various embodiments includes a first heat transfer path, which may be formed in a plurality of first shielding structures 2440 using a first heat pipe 2450 and at least one first clip 2460 on a first face of a board 2410. The electronic device 2400 according to various embodiments includes a second heat transfer path, which may be formed in a plurality of second shielding structures 2345 using a second heat pipe 2452 and at least one second clip 2462. Each of the first and second heat transfer paths may have the same structure as the heat transfer path illustrated in FIGS. 23A and 23B.

The first and second heat transfer paths according to various embodiments may be disposed symmetrically or asymmetrically on the first and second faces of the board 2410, respectively.

Although not illustrated in the drawings, two or three heat pipes may be arranged in a parallel type or a non-overlapping type in a single heat generation element so as to provide a heat dissipation structure.

Figure 25:
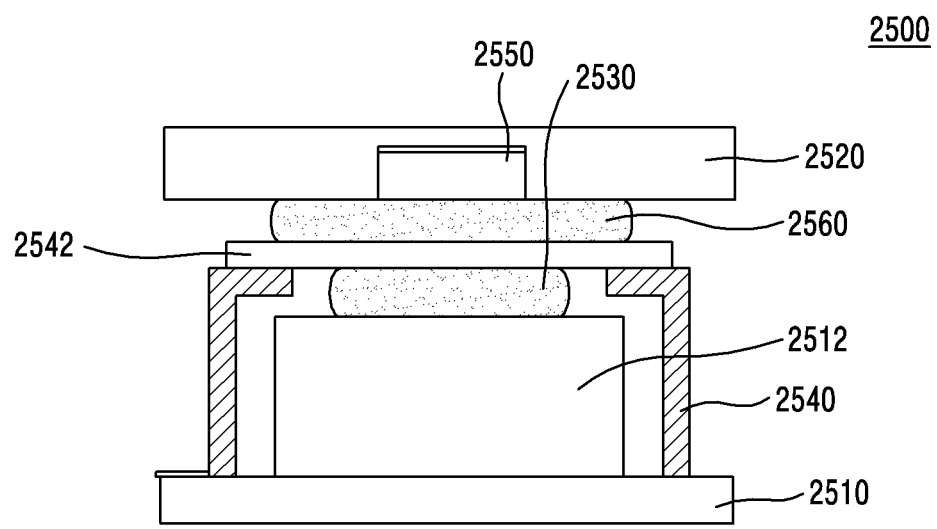
FIG. 25 is a cross-sectional view illustrating the structure of a PBA, which is provided with a heat collection/diffusion structure according to various embodiments of the present disclosure.

FIG. 25 is a cross-sectional view illustrating the structure of a PBA, which is provided with a heat dissipation structure according to various embodiments of the present disclosure.

Referring to FIG. 25, an electronic device 2500 having a heat dissipation structure according to various embodiments may be manufactured through the following method.

A heat generation element 2512 (having a thickness of about 1.15 to 1.3 mm) and a shielding structure 2540 (having a height of about 1.5 to 1.54 mm) may be mounted on a first face of a board 2510, a liquid TIM 2530 (having a thickness of about 1.3 to 1.4 mm) may be coated on the top face of the heat generation element 2512, and then a cover 2542 (having a thickness of about −0.04 to 0.06 mm) may be coupled onto the shielding structure 2540, thereby completing a primary heat dissipation structure. A vertical portion of the shielding structure 2540 may have a thickness of about 0.1 mm and a horizontal portion may have a thickness of about 0.15 mm.

A heat pipe 2550 may be attached to the support structure 2520 using a double-sided tape. A PBA having a heat dissipation structure may be formed in the sequence of attaching the solid TIM 2560 (having a thickness of about 0.15-0.25 mm) to the heat pipe 2550 attached to the support structure 2520, and attaching the solid TIM to the cover 2542.

Figure 26:
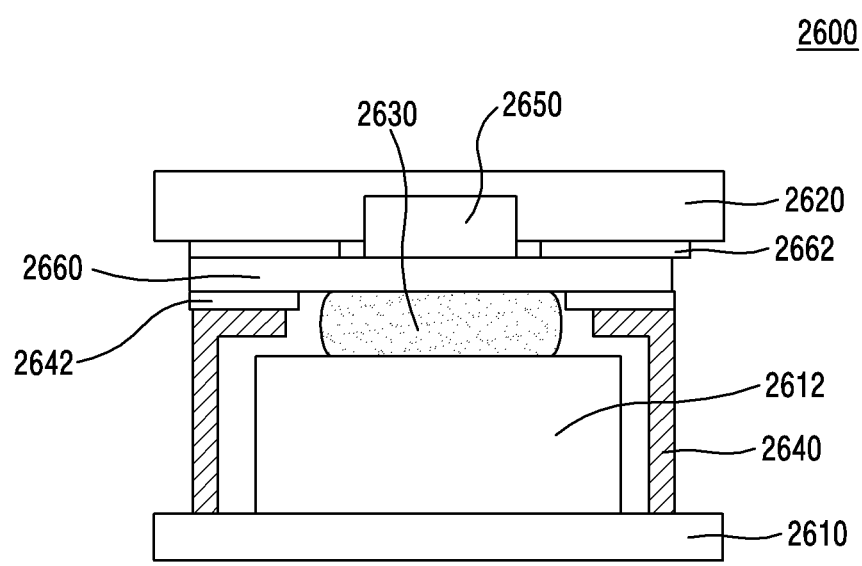
FIG. 26 is a cross-sectional view illustrating the structure of a PBA, which is provided with a heat collection/diffusion structure according to various embodiments of the present disclosure.

FIG. 26 is a cross-sectional view illustrating a structure of a PBA, which is provided with a heat dissipation structure according to various embodiments of the present disclosure.

Referring to FIG. 26, an electronic device 2600 having a heat dissipation structure according to various embodiments may be manufactured through the following method.

A heat generation element 2612 (having a thickness of about 1.15 to 1.3 mm) and a shielding structure 2640 (having a height of about 1.5 to 1.54 mm) may be mounted on a first face of a board 2610.

A heat pipe 2650 may be attached to a support structure 2620 using a double-sided tape. A module of the heat pipe 2650 attached to the support structure 2620 may be bonded to a copper plate 2660 (having a thickness of about 1.13 to 1.17 mm) to through a soldering process. Subsequently, a solid TIM 2630 and a conductive tape 2642 (having a thickness of 0.02 to 0.04 mm) may be attached to the copper plate 2660. Subsequently, a PBA having a heat dissipation structure may be manufactured in the sequence of attaching the module of the heat pipe 2650, to which the solid TIM material 2630 and the conductive tape 2642 are attached, to the shielding structure 2640 using the conductive tape 2642 at the time of coupling the support structure 2640 and the board 2610.

Figure 27:
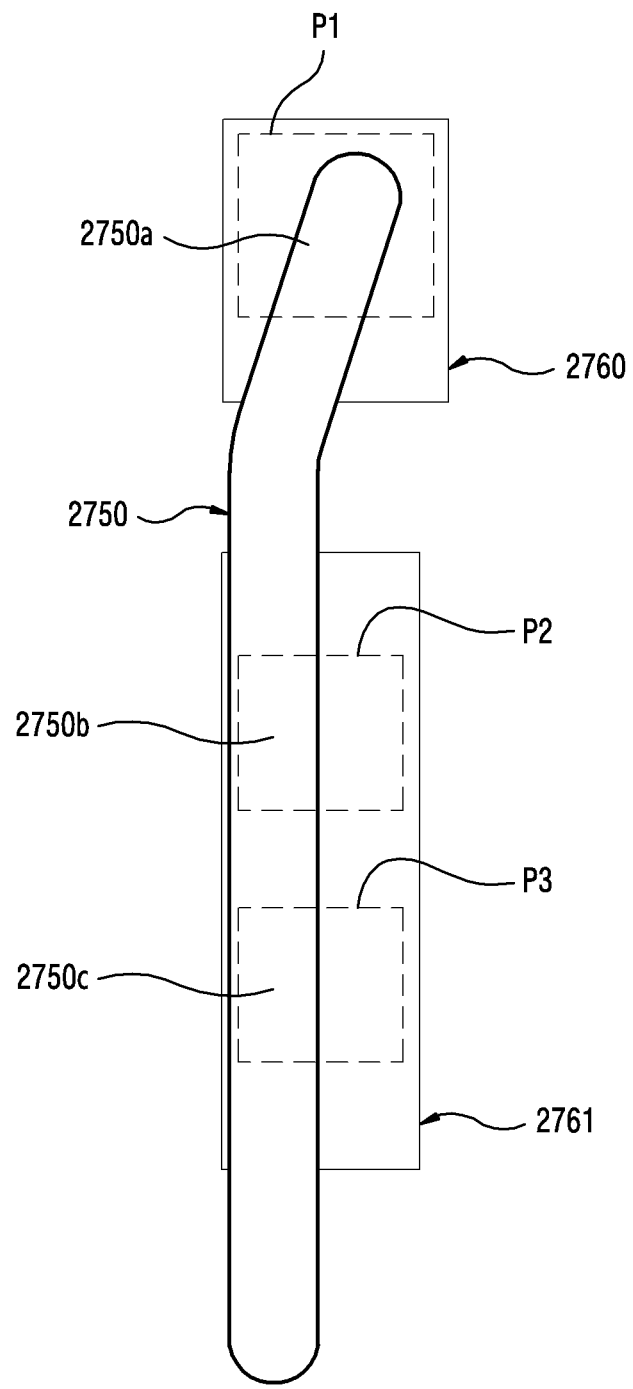
FIGS. 27 to 29 are exemplary views each illustrating a disposed state of a heat pipe to which a heat collection/diffusion device according to various embodiments of the present disclosure is coupled.

FIG. 27 is an exemplary view illustrating a disposed state of a heat pipe to which a heat collection/diffusion device according to various embodiments of the present disclosure is coupled.

Referring to FIG. 27, the heat pipe 2750 according to various embodiments may be at least partially the same as the heat pipe 450 illustrated in FIGS. 4 and 5. The heat transfer structure illustrated in FIG. 27 may be at least partially or entirely equally applied to the shielding structures of the electronic devices illustrated in FIGS. 9 to 14.

The heat pipe 2750 according to various embodiments may include first to third portions 2750a to 2750c corresponding to the first to third heat generation components P1 to P3. The first portion 2750a may be one end portion of the heat pipe 2750, the third portion 2750c may be the other end portion of the heat pipe 2750, and the second portion 2750b may be a portion of the heat pipe 2750 located between the first and third portions 2750a and 2750c.

The heat pipe 2750 according to various embodiments may be configured in various shapes, for example, in a linear shape, a curved shape, or a combination of linear and curved shapes. The length of the heat pipe 2750 may be adjusted depending on the relative positions of the first to third heat generation components P1 to P3, and the width or thickness of the heat pipe 2750 may be adjusted depending on the size of each of the first to third heat generation components P1 to P3.

The heat pipe 2750 and the first and second heat collection/diffusion devices 2760 and 2761 may be disposed on the first to third heat generation components P1 to P3 mounted on the electronic device, so that heat of the first to third heat generation components can be transferred to a relatively low temperature region and can be diffused to the periphery. The heat pipe 2750 according to various embodiments may be formed to have a flat shape in cross section in order to maximize the bonding face with the heat generation source (e.g., the heat generation components.

The electronic device according to various embodiments may include a plurality of heat generation elements. For example, the plurality of heat generation components disposed in the electronic device may include a printed circuit board on which a plurality of electronic components is disposed, and may include respective electronic components disposed on the printed circuit board. For example, the heat generation components may include a heat generation component such as a PAM, an AP, or a memory, which emits heat according to an operation mode of the electronic device among the plurality of electronic components disposed on the printed circuit board. For the convenience of explanation, it is assumed that a PAM or an IF PMIC is a first heat generation component P1, an AP is a second heat generation component P2, and a memory is a third heat generation component P3. The first heat generation component P1 may be disposed close to the first portion 2750a of the heat pipe 2750, the second heat generation component P2 may be disposed close to the second portion 2750b, and the third heat generation component P3 may be disposed close to the third portion 2750c. The first to third heat generation components P1 to P3 may respectively operate at different heat generation temperatures depending on the operation mode of the electronic device.

The heat collection/diffusion device according to various embodiments may include a plurality of heat collection/diffusion members coupled to the heat pipe 2750. Although FIG. 27 illustrates an example in which two single heat collection/diffusion members 2760 and 2761 are disposed on the heat pipe 2750, one or three or more heat collection/diffusion members may be disposed along the heat pipe 2750.

The heat collection/diffusion device according to various embodiments may include first and second heat collection/diffusion members 2760 and 2761. The first heat generation component P1 may be disposed adjacent to the first heat collection/diffusion member 2760. One or more heat generation components, e.g., the second and third heat generation components P2 and P3 may be disposed adjacent to the second heat collection/diffusion member 2761.

The heat collection/diffusion device according to various embodiments may perform a heat collection function in a first mode and a heat diffusion function in a second mode. In addition, in a third mode, a portion of the heat collection/diffusion device may perform the heat collection function and the remaining portion may perform the heat diffusion function, or in a fourth mode, a portion of the heat collection/diffusion device may perform the heat diffusion function and the remaining portion may perform the heat collection function. Heat collection may mean the function of collecting the heat transferred from heat generation components, and thermal diffusion may mean the function of diffusing the heat to the periphery.

The electronic device according to various embodiments may operate in various modes. For example, the electronic device may operate in a communication mode, a camera operation mode, a game mode, and the like. Depending on respective modes, the heat generation temperatures of the first to third heat generation components may be different from each other. For example, in the communication mode of the electronic device, the first heat generation component (e.g., a PAM (or an IF PMIC) may be a hot zone region having the highest temperature, and in the camera operation mode or the game mode, the second heat generation component (e.g., an AP) may be the hot zone region having the highest temperature. In other words, the heat generation temperatures of respective heat generation components may be different from each other depending on the operation mode of the electronic device. The third heat generation component may have a temperature, which is lower than that of the first and second heat generation components, or which is between the first and second heat generation components.

In the communication mode of the electronic device, since the first heat generation component P1 is the hot zone region having the highest temperature, the heat generated from the first heat generation component P1 can be collected by the first heat collection/diffusion member 2760, and the collected heat can be transferred to the heat pipe 2750 having a relatively low temperature. Subsequently, the heat, transferred to the heat pipe 2750 can be diffused by the second heat collection/diffusion member 2761 to a peripheral region having a relatively low temperature.

In the camera operation mode of the electronic device (e.g., a video photographing mode), since the second heat generation component P2 is the hot zone region having the highest temperature, the heat, generated from the second heat generation component P1, can be collected by a portion of the second heat collection/diffusion member 2761, and the collected heat can be transferred to the heat pipe 2750 having a relatively low temperature. Subsequently, the heat, transferred to the heat pipe 2750 can be diffused by the first heat collection/diffusion member 2760 to a peripheral region having a relatively low temperature, and can be diffused to another portion of the second heat collection/diffusion member.

Depending on the operation mode of the electronic device, i.e., depending on the temperature difference between the first to third heat generation components P1 to P3, each of the first and second heat collection/diffusion members 2760 and 2761 may serve to collect heat or to diffuse heat.

Figure 28:
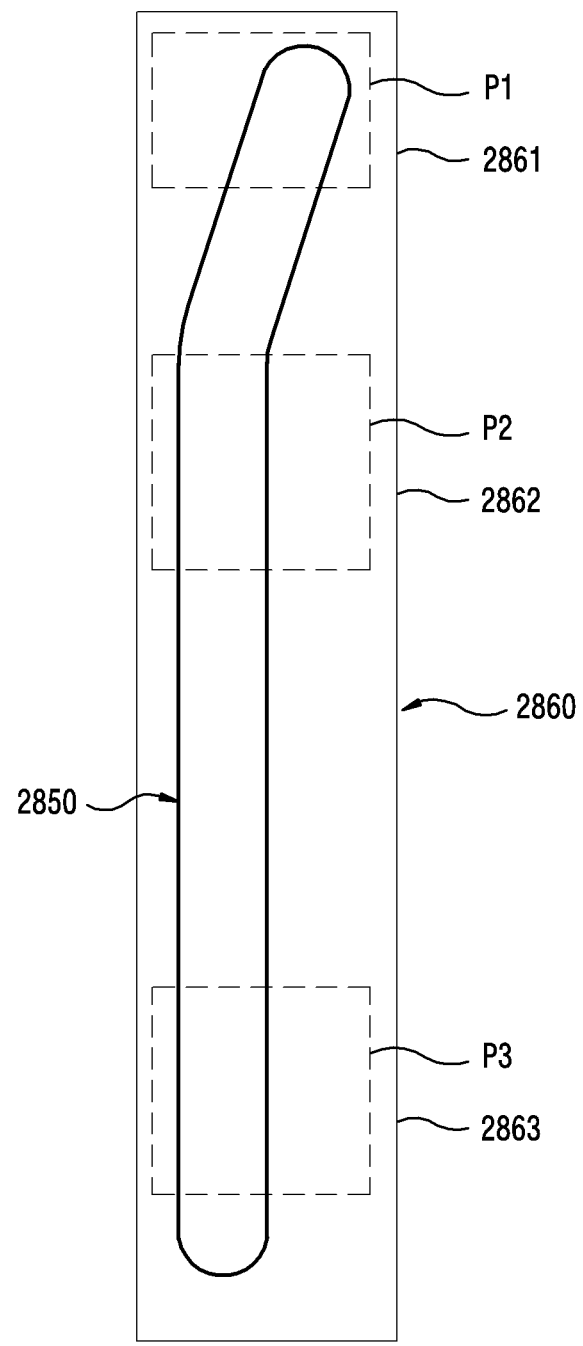

FIG. 28 is an exemplary view illustrating a disposed state of a heat pipe to which a heat collection/diffusion device according to various embodiments of the present disclosure is coupled.

Referring to FIG. 28, a heat pipe 2850 according to various embodiments may be coupled with a single heat collection/diffusion member 2860 so as to configure a heat transfer structure of a heat generation component. The heat pipe 2850 according to various embodiments may be at least partially the same as the heat pipe 450 illustrated in FIGS. 4 and 5. The heat transfer structure of the heat generation component according to various embodiments may be at least partially or entirely equally applied to the shielding structures of the electronic devices illustrated in FIGS. 9 to 14.

The heat collection/diffusion member 2860 according to various embodiments may be configured to have a size capable of sufficiently enclosing the entire heat pipe 2850. The heat collection/diffusion member 2860 may include a first portion 2861 disposed adjacent to the first heat generation component P1, a second portion 2862 disposed adjacent to the second heat generation component P2, and a third portion 2863 disposed adjacent to the third heat generation component P3. The first, second, and third portions 2861 to 2863 may be fabricated in an integrated form. For the convenience of explanation, it is assumed that a PAM or an IF PMIC is a first heat generation component P1, an AP is a second heat generation component P2, and a memory is a third heat generation component P3.

In the communication mode of the electronic device, since the first heat generation component P1 is the hot zone region having the highest temperature, the heat, generated from the first heat generation component P1, can be collected by the first portion 2861 of the heat collection/diffusion member 2861, and the collected heat can be transferred to the heat pipe 2862 and the second portion 2862, which have a relatively low temperature. Subsequently, the heat, transferred to the heat pipe 2850 can be diffused by the heat collection/diffusion member 2860 to a peripheral region, which has a relatively low temperature.

In the camera operation mode of the electronic device (e.g., a video photographing mode), since the second heat generation component P2 is the hot zone region having the highest temperature, the heat, generated from the second heat generation component P2, can be collected by the second portion of the heat collection/diffusion member 2862, and the collected heat can be diffused to each of the heat pipe 2850 and the other first and third portions 2861 and 2863, which have a relatively low temperature.

Depending on the operation mode of the electronic device, i.e., depending on the temperature difference between the first to third heat generation components P1 to P3, each of the first to third portions 2861 to 2863 of each heat collection/diffusion member may serve to collect heat or to diffuse heat.

Figure 29:
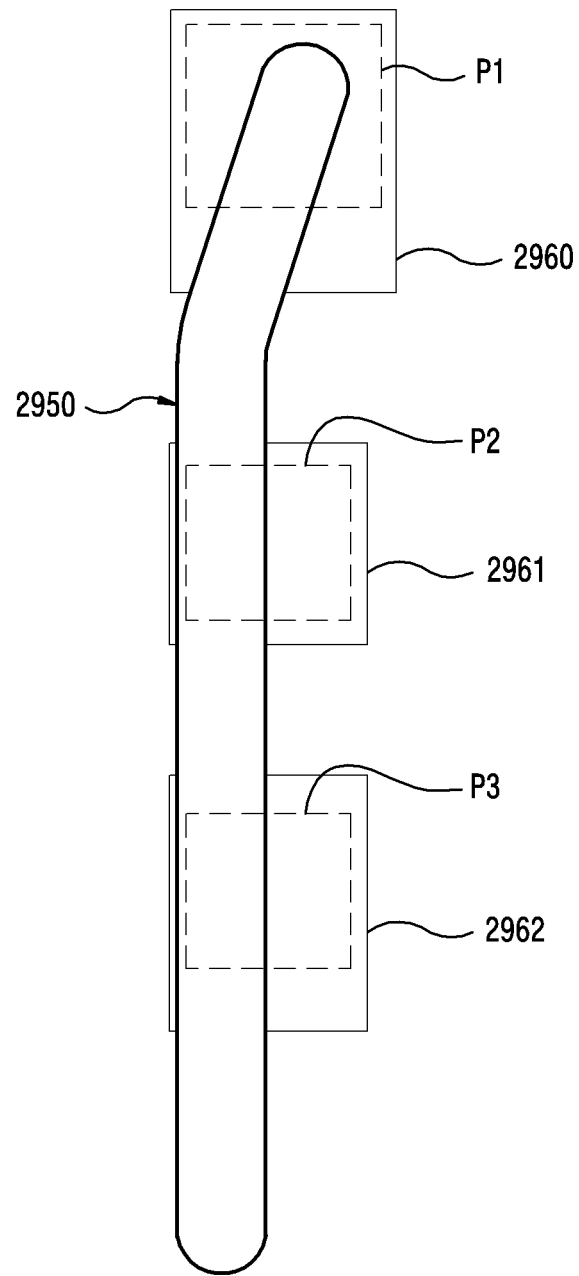

FIG. 29 is an exemplary view illustrating a disposed state of a heat pipe to which a heat collection/diffusion device according to various embodiments of the present disclosure is coupled.

Referring to FIG. 29, a heat pipe 2950 according to various embodiments may be coupled with a plurality of heat collection/diffusion member 2960 to 2963 so as to configure a heat transfer structure of first to third heat generation components P1 to P3. The heat pipe 2950 according to various embodiments may be at least partially the same as the heat pipe 450 illustrated in FIGS. 4 and 5. The heat transfer structure of the heat generation component according to various embodiments may be at least partially or entirely equally applied to the shielding structures of the electronic devices illustrated in FIGS. 9 to 14.

The heat collection/diffusion device according to various embodiments may include first to third heat collection/diffusion members 2960 to 2962, which are disposed in the heat pipe, for example, respective portions where the first to third heat generation components P1 to P3 are disposed. The heat collection/diffusion device may include a first heat collection/diffusion member 2960 disposed adjacent to the first heat generation component P1, a second heat collection/diffusion member 2961 disposed adjacent to the second heat generation component P2, and a third heat collection/diffusion 2962 disposed adjacent to the third heat generation component P3. The first, second, and third heat collection/diffusion members 2960 to 2962 may be individually manufactured and may be disposed to be spaced apart from each other along the heat pipe 2950. For the convenience of explanation, it is assumed that a PAM or an IF PMIC is a first heat generation component P1, an AP is a second heat generation component P2, and a memory is a third heat generation component P3.

In the communication mode of the electronic device, since the first heat generation component P1 is the hot zone region having the highest temperature, the heat generated from the first heat generation component P1 can be collected by the first heat collection/diffusion member 2960, and the collected heat can be transferred to the heat pipe 2950 having a relatively low temperature. Subsequently, the heat, transferred to a peripheral region having a relatively low temperature can be diffused by the second and third heat collection/diffusion members 2961 and 2962.

In the camera operation mode of the electronic device (e.g., a video photographing mode), since the second heat generation component P2 is the hot zone region having the highest temperature, the heat, generated from the second heat generation component P2, can be collected by the second heat collection/diffusion member 2961, and the collected heat can be diffused by each of the first and third collection/diffusion members 2960 and 2962 via the heat pipe 2950 having a relatively low temperature.

Depending on the operation mode of the electronic device, i.e., depending on the temperature difference between the first to third heat generation components P1 to P3, each of the first to third heat collection/diffusion members 2960 to 2962 may serve to collect heat or to diffuse heat.

The term "module," as used herein may represent, for example, a unit including a combination of one or two or more of hardware, software, or firmware. The "module" may be, for example, used interchangeably with the terms "unit", "logic", "logical block", "component", or "circuit" etc. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific integrated circuit (ASIC) chip, Field-Programmable Gate Arrays (FPGAs) and a programmable-logic device performing some operations known to the art or to be developed in the future.

At least a part of an apparatus (e.g., modules or functions thereof) or method (e.g., operations) according to the present invention may be, for example, implemented as instructions stored in a computer-readable storage medium in a form of a programming module. In case that the instruction is executed by a processor (e.g., processor 120), and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a Compact Disc-Read Only Memory (CD-ROM) and a Digital Versatile Disc (DVD)), a Magneto-Optical Medium (e.g., a floptical disk), and a hardware device (e.g., a Read Only Memory (ROM), a Random Access Memory (RAM), a flash memory, etc.). Also, the program instruction may include not only a mechanical language code such as a code made by a compiler but also a high-level language code executable by a computer using an interpreter, etc. The aforementioned hardware device may be constructed to operate as one or more software modules in order to perform operations of the present invention, and vice versa.

The module or programming module according to the present invention may include at least one or more of the aforementioned constituent elements, or omit some of the aforementioned constituent elements, or further include additional other constituent elements. Operations carried out by the module, the programming module or the other constituent elements according to the present invention may be executed in a sequential, parallel, repeated or heuristic method. Also, some operations may be executed in different order or may be omitted, or other operations may be added.

Meanwhile, the exemplary embodiments disclosed in the specification and drawings are merely presented to easily describe the technical contents of the present disclosure and help with the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

The invention claimed is:

1. A portable communication device comprising:
a display module;
a printed circuit board disposed below the display module;
an electronic component disposed on a surface, of the printed circuit board, directed toward the display module;
a first thermal interfacing material disposed on the electronic component;
a shielding member enclosing the electronic component and configured to shield the electronic component to mitigate electromagnetic interference associated with the electronic component, wherein the shielding member comprises:
a shield frame mounted to the printed circuit board and including side walls and a top wall having an opening, and
a shield cover disposed to cover the opening of the top wall of the shield frame such that the first thermal interfacing material is disposed between the electronic component and the shield cover, wherein the shield cover has a thickness which is thinner than a thickness of the side walls of the shield frame;
a second thermal interfacing material disposed on the shield cover of the shielding member;
a heat pipe configured to receive at least a portion of heat radiated from the electronic component through the first thermal interfacing material, the shielding member and the second thermal interfacing material, wherein at least a portion of the heat pipe is disposed between a support member and the second thermal interfacing material;
the support member for mechanically supporting the display module, the support member having a first side directed toward the display module and a second side directed toward the printed circuit board, the second side of the support member including a recess in which at least a portion of the heat pipe is disposed,
wherein the recess extends from the second side of the support member towards the first side of the support member, and
wherein an entirety of the heat pipe is disposed at the second side the support member.

2. The portable communication device of claim 1,
wherein the side walls of the shield frame are substantially perpendicular to the printed circuit board and the shield cover is substantially parallel to the printed circuit board,
wherein each of the side walls of the shield frame is spaced apart from one corresponding side face of the electronic component, and wherein an inner area of the shield cover is in contact with the first thermal interfacing material.

3. The portable communication device of claim 2, wherein at least a portion of an outer area, of the shield cover, encloses the inner area and is in contact with the shield frame.

4. The portable communication device of claim 1, wherein the shield cover comprises a metal film or metal sheet.

5. The portable communication device of claim 1,
wherein the first thermal interfacing material includes liquid thermal interfacing material, and
wherein the second thermal interfacing material includes solid thermal interfacing material.

6. The portable communication device of claim 1, wherein the first thermal interfacing material is a different material than the second thermal interfacing material.

7. The portable communication device of claim 1, wherein the first thermal interfacing material is a same material as the second thermal interfacing material.

8. The portable communication device of claim 1, further comprising:
a heat collection device disposed directly on the second thermal interfacing material and configured to receive heat from the second thermal interfacing material.

9. The portable communication device of claim 8, wherein the heat collection device comprises copper.

10. The portable communication device of claim 1,
wherein the support member comprises an opening proximate to the heat pipe, and
wherein the heat pipe is configured to transfer at least some of the heat towards the opening.

11. The portable communication device of claim 1, further comprising:
a bonding material for bonding at least one or more portions of the heat pipe to the support member, the bonding material being disposed between the at least one or more portions of the heat pipe and the support member.

12. The portable communication device of claim 1, wherein the support member is disposed on a left side, a right side, and a top side of the heat pipe.

13. A portable communication device comprising:
a display module;
a battery;
a printed circuit board disposed below the display module;
an electronic component disposed on a surface, of the printed circuit board, directed toward the display module;
a first thermal interfacing material disposed on the electronic component;
a shielding member enclosing the electronic component and configured to shield the electronic component to mitigate electromagnetic interference associated with the electronic component, wherein the shielding member comprises:
a shield frame mounted to the printed circuit board and including side walls and a top wall having an opening, and
a shield cover disposed to cover the opening of the top wall of the shield frame such that the first thermal interfacing material is disposed between the electronic component and the shield cover, wherein the shield cover has a thickness which is thinner than a thickness of the side walls of the shield frame;

a second thermal interfacing material disposed on the shield cover of the shielding member;

a heat pipe configured to receive at least a portion of heat radiated from the electronic component through the first thermal interfacing material, the shielding member and the second thermal interfacing material, wherein at least a portion of the heat pipe is disposed between a support member and the second thermal interfacing material; and the support member for mechanically supporting the display module, the support member having a first side directed toward the display module and a second side directed toward the printed circuit board, the second side of the support member including a recess in which at least a portion of the heat pipe is disposed, wherein the printed circuit board has a cutout portion for accommodating the battery, wherein the recess is formed in the second side of the support member to face the printed circuit board, without overlapping with the battery, when viewed in a direction perpendicular to the surface of the printed circuit board, wherein the recess extends from the second side of the support member towards the first side of the support member, and wherein an entirety of the heat pipe is disposed at the second side of the support member.

14. The portable communication device of claim 13, wherein the support member includes an area for accommodating the battery and the recess is formed in the second side of the support member outside the area for accommodating the battery.

15. The portable communication device of claim 13,
wherein the side walls of the shield frame are substantially perpendicular to the printed circuit board and the shield cover is substantially parallel to the printed circuit board,
wherein each of the side walls of the shield frame is spaced apart from one corresponding side face of the electronic component, and
wherein an inner area of the shield cover is in contact with the first thermal interfacing material.

16. The portable communication device of claim 13, wherein at least a portion of an outer area, of the shield cover, encloses the inner area and is in contact with the shield frame.

17. The portable communication device of claim 13, wherein the shield cover comprises a metal film or metal sheet.

18. The portable communication device of claim 13,
wherein the first thermal interfacing material includes liquid thermal interfacing material, and
wherein the second thermal interfacing material includes solid thermal interfacing material.

19. The portable communication device of claim 13, wherein the first thermal interfacing material is a different material than the second thermal interfacing material.

20. The portable communication device of claim 13, wherein the first thermal interfacing material is a same material as the second thermal interfacing material.

21. The portable communication device of claim 13, further comprising:
a heat collection device disposed directly on the second thermal interfacing material and configured to receive heat from the second thermal interfacing material.

22. The portable communication device of claim 21, wherein the heat collection device comprises copper.

23. The portable communication device of claim 13,
wherein the support member comprises an opening proximate to the heat pipe, and
wherein the heat pipe is configured to transfer at least some of the heat towards the opening.

24. The portable communication device of claim 13, further comprising:
a bonding material for bonding at least one or more portions of the heat pipe to the support member, the bonding material being disposed between the at least one or more portions of the heat pipe and the support member.

25. The portable communication device of claim 13, wherein the support member is disposed on a left side, a right side, and a top side of the heat pipe.

* * * * *

UNITED STATES PATENT AND TRADEMARK OFFICE
CERTIFICATE OF CORRECTION

PATENT NO. : 10,798,849 B2
APPLICATION NO. : 16/515275
DATED : October 6, 2020
INVENTOR(S) : Haejin Lee et al.

Page 1 of 1

It is certified that error appears in the above-identified patent and that said Letters Patent is hereby corrected as shown below:

On the Title Page

Between item (63) and item (51), insert:
--(30)   Foreign Application Priority Data
Feb. 18, 2016 (KR) ........................ 10-2016-0019155
Nov. 1, 2016 (KR) ........................ 10-2016-0144165--

Signed and Sealed this
Seventeenth Day of November, 2020

Andrei Iancu
*Director of the United States Patent and Trademark Office*